(12) United States Patent
Oliver et al.

(10) Patent No.: US 10,199,553 B1
(45) Date of Patent: Feb. 5, 2019

(54) SHIELDED THROUGH VIA STRUCTURES AND METHODS FOR FABRICATING SHIELDED THROUGH VIA STRUCTURES

(71) Applicant: Massachusetts Institute of Technology, Cambridge, MA (US)

(72) Inventors: William D. Oliver, Arlington, MA (US); Andrew J. Kerman, Arlington, MA (US); Rabindra N. Das, Lexington, MA (US); Donna-Ruth W. Yost, Acton, MA (US); Danna Rosenberg, Arlington, MA (US); Mark A. Gouker, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/342,517

(22) Filed: Nov. 3, 2016

Related U.S. Application Data

(60) Provisional application No. 62/251,248, filed on Nov. 5, 2015.

(51) Int. Cl.
*H01L 39/04* (2006.01)
*H01L 23/498* (2006.01)
*H01L 23/552* (2006.01)

(52) U.S. Cl.
CPC ........ *H01L 39/04* (2013.01); *H01L 23/49827* (2013.01); *H01L 23/552* (2013.01)

(58) Field of Classification Search
CPC .. H01L 39/04; H01L 23/552; H01L 23/49827
USPC ......................................................... 257/31
See application file for complete search history.

(56) References Cited

U.S. PATENT DOCUMENTS

| | | | |
|---|---|---|---|
| 4,316,200 A | 2/1982 | Ames et al. |
| 4,612,083 A | 9/1986 | Yasumoto et al. |
| 5,057,877 A | 10/1991 | Briley et al. |
| 5,156,997 A | 10/1992 | Kumar et al. |
| 5,179,070 A | 1/1993 | Harada et al. |
| 5,371,328 A | 12/1994 | Gutierrez et al. |
| 5,650,353 A | 7/1997 | Yoshizawa et al. |
| 5,773,875 A | 6/1998 | Chan |
| 6,108,214 A | 8/2000 | Fuse |
| 6,297,551 B1 | 10/2001 | Dudderar et al. |

(Continued)

FOREIGN PATENT DOCUMENTS

| | | |
|---|---|---|
| WO | WO 2016/025451 A1 | 2/2016 |
| WO | WO 2016/025478 A1 | 2/2016 |

(Continued)

OTHER PUBLICATIONS

U.S. Appl. No. 14/694,540, filed Apr. 23, 2015, Das et al.

(Continued)

*Primary Examiner* — Fernando L Toledo
*Assistant Examiner* — Adam S Bowen
(74) *Attorney, Agent, or Firm* — Daly, Crowley, Mofford & Durkee, LLP

(57) ABSTRACT

Described are concepts, systems, circuits and techniques related to shielded through via structures and methods for fabricating such shielded through via structures. The described shielded through via structures and techniques allow for assembly of multi-layer semiconductor structures including one or more superconducting semiconductor structures (or integrated circuits).

10 Claims, 15 Drawing Sheets

(56) References Cited

U.S. PATENT DOCUMENTS

| | | | |
|---|---|---|---|
| 6,324,755 | B1 | 12/2001 | Borkowski et al. |
| 6,346,469 | B1 | 2/2002 | Greer |
| 6,355,501 | B1 | 3/2002 | Fung et al. |
| 6,396,371 | B2 | 5/2002 | Streeter et al. |
| 6,436,740 | B1 | 8/2002 | Jen et al. |
| 6,485,565 | B1 | 11/2002 | Springer |
| 6,678,167 | B1 | 1/2004 | Degani et al. |
| 6,819,000 | B2 | 11/2004 | Magerlein et al. |
| 6,825,534 | B2 | 11/2004 | Chen et al. |
| 6,838,774 | B2 | 1/2005 | Patti |
| 7,427,803 | B2 | 9/2008 | Chao et al. |
| 7,589,390 | B2 | 9/2009 | Yao |
| 7,624,088 | B2 | 11/2009 | Johnson et al. |
| 7,932,515 | B2 | 4/2011 | Bunyk |
| 7,939,926 | B2 | 5/2011 | Kaskoun et al. |
| 7,993,971 | B2 | 8/2011 | Chatterjee et al. |
| 8,202,785 | B2 | 6/2012 | Castex et al. |
| 8,354,746 | B2 | 1/2013 | Huang et al. |
| 8,466,036 | B2 | 6/2013 | Brindle et al. |
| 8,487,444 | B2 | 7/2013 | Law et al. |
| 8,492,911 | B2 | 7/2013 | Bachman et al. |
| 8,519,543 | B1 | 8/2013 | Song et al. |
| 8,546,188 | B2 | 10/2013 | Liu et al. |
| 8,564,955 | B2 | 10/2013 | Schmidt et al. |
| 8,736,068 | B2 | 5/2014 | Bartley et al. |
| 8,754,321 | B2 | 6/2014 | Schroeder et al. |
| 8,828,860 | B2 | 9/2014 | Gruber et al. |
| 8,928,128 | B2 | 1/2015 | Karikalan et al. |
| 8,954,125 | B2 | 2/2015 | Corcoles Gonzalez et al. |
| 9,076,658 | B1 | 7/2015 | Brown et al. |
| 9,171,792 | B2 | 10/2015 | Sun et al. |
| 2001/0016383 | A1 | 8/2001 | Chen et al. |
| 2002/0094661 | A1 | 7/2002 | Enquist et al. |
| 2003/0067073 | A1 | 4/2003 | Akram et al. |
| 2004/0124538 | A1 | 7/2004 | Reif et al. |
| 2004/0188845 | A1 | 9/2004 | Iguchi et al. |
| 2006/0191640 | A1 | 8/2006 | Johnson |
| 2007/0087544 | A1 | 4/2007 | Chang et al. |
| 2007/0119812 | A1 | 5/2007 | Kerdiles et al. |
| 2007/0207592 | A1 | 9/2007 | Lu et al. |
| 2008/0093747 | A1 | 4/2008 | Enquist et al. |
| 2008/0122115 | A1 | 5/2008 | Popa et al. |
| 2008/0169559 | A1 | 7/2008 | Yang |
| 2008/0230916 | A1 | 9/2008 | Saito et al. |
| 2008/0290790 | A1 | 11/2008 | Jin |
| 2008/0316714 | A1 | 12/2008 | Eichelberger et al. |
| 2009/0078966 | A1 | 3/2009 | Asai et al. |
| 2009/0173936 | A1 | 7/2009 | Bunyk |
| 2009/0186446 | A1 | 7/2009 | Kwon et al. |
| 2009/0233436 | A1 | 9/2009 | Kim et al. |
| 2010/0001399 | A1 | 1/2010 | Topacio |
| 2010/0026447 | A1 | 2/2010 | Keefe et al. |
| 2010/0122762 | A1 | 5/2010 | George |
| 2010/0130016 | A1 | 5/2010 | DeVilliers |
| 2010/0148371 | A1 | 6/2010 | Kaskoun et al. |
| 2010/0171093 | A1 | 7/2010 | Kabir |
| 2011/0049675 | A1 | 3/2011 | Nagai et al. |
| 2011/0140271 | A1 | 6/2011 | Daubenspeck et al. |
| 2011/0189820 | A1 | 8/2011 | Sasaki et al. |
| 2011/0204505 | A1 | 8/2011 | Pagaila et al. |
| 2011/0237069 | A1 | 9/2011 | Miyazaki |
| 2011/0248396 | A1 | 10/2011 | Liu et al. |
| 2012/0032340 | A1 | 2/2012 | Choi et al. |
| 2012/0074585 | A1 | 3/2012 | Koo et al. |
| 2012/0217642 | A1 | 8/2012 | Sun et al. |
| 2012/0228011 | A1 | 9/2012 | Chang et al. |
| 2012/0231621 | A1 | 9/2012 | Chang et al. |
| 2012/0252189 | A1 | 10/2012 | Sadaka et al. |
| 2012/0292602 | A1 | 11/2012 | Guo et al. |
| 2013/0029848 | A1 | 1/2013 | Gonzalez et al. |
| 2013/0093104 | A1 | 4/2013 | Wu et al. |
| 2013/0099235 | A1 | 4/2013 | Han |
| 2013/0147036 | A1 | 6/2013 | Choi et al. |
| 2013/0153888 | A1 | 6/2013 | Inoue et al. |
| 2013/0187265 | A1 | 7/2013 | Shih et al. |
| 2013/0244417 | A1 | 9/2013 | Markunas et al. |
| 2014/0001604 | A1 | 1/2014 | Sadaka |
| 2014/0065771 | A1 | 3/2014 | Gruber et al. |
| 2014/0113828 | A1 | 4/2014 | Gilbert et al. |
| 2014/0246763 | A1 | 9/2014 | Bunyk |
| 2014/0264890 | A1 | 9/2014 | Breuer et al. |
| 2015/0041977 | A1 | 2/2015 | Daubenspeck et al. |
| 2015/0054151 | A1 | 2/2015 | Choi et al. |
| 2015/0054167 | A1 | 2/2015 | Pendse |
| 2015/0054175 | A1 | 2/2015 | Meinhold et al. |
| 2015/0187840 | A1* | 7/2015 | Ladizinsky ............ B82Y 10/00 257/32 |
| 2015/0348874 | A1 | 12/2015 | Tsai et al. |
| 2016/0364653 | A1* | 12/2016 | Chow .................. G06N 99/002 |

FOREIGN PATENT DOCUMENTS

| | | |
|---|---|---|
| WO | WO 2016/073049 A1 | 5/2016 |
| WO | WO 2016/118209 A2 | 7/2016 |
| WO | WO 2016/118210 A2 | 7/2016 |
| WO | WO 2017/015432 A1 | 1/2017 |

OTHER PUBLICATIONS

U.S. Appl. No. 15/271,755, filed Sep. 21, 2016, Das.
U.S. Appl. No. 15/303,800, filed Oct. 13, 2016, Das, et al.
PCT Search Report of the ISA for PCT Appl. No. PCT/US2015/059181 dated Sep. 7, 2016; 5 pages.
PCT Written Opinion of the ISA for PCT Appl. No. PCT/US2015/059181 dated Sep. 7, 2016; 12 pages.
PCT Search Report of the ISA for PCT Appl. No. PCT/US2015/059200 dated Jul. 21, 2016; 3 pages.
PCT Written Opinion of the ISA for PCT Appl. No. PCT/US2015/059200 dated Jul. 21, 2016; 13 pages.
PCT Search Report of the ISA for PCT Appl. No. PCT/US2015/044608 dated Dec. 31, 2015; 5 pages.
PCT Written Opinion of the ISA for PCT Appl. No. PCT/US2015/2015/044608 dated Dec. 31, 2015; 7 pages.
PCT Search Report of the ISA for PCT Appl. No. PCT/US2015/044679 dated Apr. 13, 2016; 3 pages.
PCT Written Opinion of the ISA for PCT Appl. No. PCT/US2015/044679 dated Apr. 13, 2016; 7 pages.
PCT Search Report of the ISA for PCT Appl. No. PCT/US2015/044651 dated Nov. 4, 2015; 3 pages.
PCT Written Opinion of the ISA for PCT Appl. No. PCT/US2015/044651 dated Nov. 4, 2015; 12 pages.
U.S. Appl. No. 15/312,063, filed Nov. 17, 2016, Das et al.
PCT International Search Report of the ISA for Appl. No. PCT/US2016/060263 dated Jan. 10, 2017; 3 pages.
PCT Written Opinion of the ISA for Appl. No. PCT/US2016/060263 dated Jan. 10, 2017; 6 pages.
Ohya, et al.; "Room Temperature Deposition of Sputtered TiN Films for Superconducting Coplanar Waveguide Resonators;" IOP Publishing—Superconductor Science and Technology; vol. 27; Mar. 26, 2014; 10 pages.
Tarniowy, et al., "The Effect of Thermal Treatment on the Structure, Optical and Electrical Properties of Amorphous Titanium Nitride Thin Films;" Thin Solid Films 311; 1997; 8 pages.
PCT Search Report of the ISA for PCT/US2016/052824 dated Feb. 3, 2017; 6 pages.
PCT Written Opinion of the ISA for PCT/US2016/052824 dated Feb. 3, 20017; 6 pages.
PCT Search Report of the ISA for PCT/US2016/043266 dated Dec. 5, 2016; 5 pages.
PCT Written Opinion of the ISA for PCT/US2016/043266 dated Dec. 5, 2016; 9 pages.
Office Action dated Mar. 3, 2017 for U.S. Appl. No. 14/694,540; dated 16 pages.
International Preliminary Report dated Feb. 23, 2017 for PCT Application No. PCT/US2015/044608; 9 pages.
International Preliminary Report dated Feb. 23, 2017 for PCT Application No. PCT/US2015/044679; 9 pages.

(56) References Cited

OTHER PUBLICATIONS

International Preliminary Report dated Feb. 23, 2017 for PCT Application No. PCT/US2015/044651; 10 pages.
Office Action dated Mar. 24, 2017, for U.S. Appl. No. 15/303,800, 39 pages.
PCT Search Report of the ISA for PCT/US2016/060296 dated Mar. 10, 2017; 5 pages.
PCT Written Opinion of the ISA for PCT/US2016/060296 dated Mar. 10, 2017; 5 pages.
PCT Search Report of the ISA for PCT/US2016/60309 dated Mar. 24, 2017; 6 pages.
PCT Written Opinion of the ISA for PCT/US2016/060309 dated Mar. 24, 2017, 10 pages.
Restriction Requirement dated Apr. 28, 2017 for U.S. Appl. No. 15/342,444; 9 pages.
Response to Restriction Requirement and Preliminary Amendment dated Apr. 28, 2017 for U.S. Appl. No. 15/342,444, as filed May 19, 2017; 6 pages.
Restriction Requirement dated May 16, 2017 for U.S. Appl. No. 15/327,249; 6 pages.
PCT International Preliminary Report on Patentability dated May 18, 2017 for PCT Appl. No. PCT/US2015/059181; 11 pages.
PCT International Preliminary Report on Patentability dated May 18, 2017 for PCT Appl. No. PCT/US2015/059200; 11 pages.
Burns, et al., "3D Circuit Integration Technology for Multiproject Fabrication;" MIT Lincoln Laboratory Presentation; Apr. 7, 2000; 15 pages.
Courtland; "Google Aims for Quantum Computing Supremacy;" Spectrum.IEEE.Org; North America; Jun. 2017; 2 pages.
International Search Report of the ISA for PCT Appl. No. PCT/US2016/060343 dated Jul. 18, 2017; 3 pages.
International Written Opinion of the ISA for PCT Appl. No. PCT/2016/060343 dated Jul. 18, 12 pages.
Notice of Allowance for U.S. Appl. No. 15/327,235 dated Jun. 30, 2017; 17 pages.
Notice of Allowance for U.S. Appl. No. 14/694,540 dated Aug. 2, 2017; 17 pages.
Notice of Allowance for U.S. Appl. No. 15/312,063 dated Aug. 2, 2017; 17 pages.
Office Action dated Jul. 7, 2017 for U.S. Appl. No. 15/271,755; 26 pages.
Response to Office Action dated Mar. 3, 2017 for U.S. Appl. No. 14/694,540 as filed Jun. 1, 2017; 24 pages.
Response to Office Action dated Mar. 24, 2017 for U.S. Appl. No. 15/303,800 as filed Jun. 26, 2017; 22 pages.
Response to Restriction Requirement dated May 16, 2017 for U.S. Appl. No. 15/327,249 as filed Jun. 27, 2017; 1 page.
Response to Restriction Requirement dated Jun. 8, 2017 for U.S. Appl. No. 15/271,755 as filed Jun. 19, 2017; 1 page.
Office Action dated Aug. 11, 201 for U.S. Appl. No. 15/342,44; 22 pages.
U.S. Appl. No. 15/684,269, filed Aug. 23, 2017, Das et al.
U.S. Appl. No. 15/684,337, filed Aug. 23, 2017, Das, et al.
U.S. Appl. No. 15/684,393, filed Aug. 23, 2017, Das et al.
Notice of Allowance dated Oct. 12, 2017 for U.S. Appl. No. 15/303,800; 16 pages.
Restriction Requirement for U.S. Appl. No. 15/271,755 dated Jun. 9, 2017; 6 pages.
Response to Jul. 7, 2017 Office Action for U.S. Appl. No. 15/271,755 as filed Oct. 10, 2017; 33 pages.
Response to Aug. 11, 2017 Office Action for U.S. App. No. 15/342,444 as filed Sep. 15, 2017; 20 pages.
Office Action dated Oct. 20, 2017 for U.S. Appl. No. 15/327,249; 30 pages.
Final Office Action dated Dec. 6, 2017 for U.S. Appl. No. 15/342,444; 18 pages.
Final Office Action dated Dec. 20, 2017 for U.S. Appl. No. 15/271,755; 25 pages.
U.S. Appl. 15/745,914, filed Jan. 18, 2018, Oliver, et al.
Office Action dated Jan. 11, 2018 for U.S. Appl. No. 15/327,239; 33 pages.
PCT International Preliminary Report on Patentability dated Feb. 1, 2018 for PCT Appl. No. PCT/US2016/043266; 11 pages.
Response to Final Office Action dated Dec. 6, 2017 for U.S. Appl. No. 15/342,444; Response filed Mar. 2, 2018; 16 pages.
Restriction Requirement dated Jan. 3, 2018 for U.S. Appl. No. 15/342,478; 6 pages.
Response to Restriction Requirement dated Jan. 3, 2018 for U.S. Appl. No. 15/342,478 as filed Mar. 2, 2018; 6 pages
Advisory Action dated Mar. 20, 2018 for U.S. Appl. No. 15/342,444; 3 pages.
U.S. Non-Final Office Action dated Mar. 21, 2018 for U.S. Appl. No. 15/342,589; 25 pages.
U.S. Appl. No. 15/342,478, filed Nov. 3, 2016, Oliver, et al.
U.S. Appl. No. 15/342,589, filed Nov. 3, 2016, Oliver, et al.
U.S. Appl. No. 15/342,444, filed Nov. 3, 2016, Oliver, et al.
Response to Non-Final Office Action dated Apr. 23, 2018 for U.S. Appl. No. 15/342,478 as filed Aug. 23, 2018; 18 pages.
Notice of Allowance dated Jul. 9, 2018 for U.S. Appl. No. 15/327,249; 15 pages.
Notice of Allowance dated Jul. 18, 2018 for U.S. Appl. No. 15/342,444; 11 pages.
Office Action dated Aug. 9, 2018 for U.S. Appl. No. 15/271,755; 29 pages.
U.S. Non-Final Office Action dated Apr. 23, 2018 for U.S. Appl. No. 15/342,478; 11 pages.
Response to U.S. Non-Final Office Action dated Jan. 11, 2018 for U.S. Appl. No. 15/327,239; Response filed Apr. 9, 2018; 25 pages.
Response to U.S. Non-Final Office Action dated Oct. 20, 2017 for U.S. Appl. No. 15/327,249; Response filed Apr. 19, 2018; 19 pages.
Response to U.S. Final Office Action dated Dec. 20, 2017 for U.S. Appl. No. 15/271,755; Response filed Apr. 23, 2018; 23 pages.
U.S. Final Office Action dated May 9, 2018 for U.S. Appl. No. 15/327,239; 25 pages.
Response to U.S. Final Office Action dated Dec. 6, 2017 for U.S. Appl. No. 15/342,444; Response filed May 4, 2018; 18 pages.
U.S. Non-Final Office Action dated May 11, 2018 for U.S. Appl. No. 15/684,393; 15 pages.
PCT International Preliminary Report dated May 17, 2018 for International Application No. PCT/US2016/060296; 7 pages.
PCT International Preliminary Report dated May 17, 2018 for International Application No. PCT/US2016/060343; 9 pages.
PCT International Preliminary Report dated May 17, 2018 for International Application No. PCT/US2016/060263; 8 pages.
PCT International Preliminary Report dated May 17, 2018 for International Application No. PCT/US2016/060309; 8 pages.

\* cited by examiner

SHIELDED THROUGH VIA STRUCTURES AND METHODS FOR FABRICATING SHIELDED THROUGH VIA STRUCTURES

CROSS REFERENCE TO RELATED APPLICATION

This application claims the benefit of U.S. Provisional Application No. 62/251,248 filed Nov. 5, 2015 under 35 U.S.C. § 119(e) which application is hereby incorporated herein by reference in its entirety. Also, the subject matter of application Ser. Nos. 15/342,478, 15/342,589 and 15/342,444 all filed on even date herewith are hereby incorporated herein by reference in their entireties.

GOVERNMENT RIGHTS

This invention was made with Government support under Contract No. FA8721-05-C-0002 awarded by the U.S. Air Force. The Government has certain rights in the invention.

FIELD

This disclosure relates generally to via structures, and more particularly, to shielded through via structures and methods for fabricating shielded through via structures.

BACKGROUND

As is known, there is trend toward miniaturization of electronic products such as mobile phones, tablets, digital cameras, and the like. There is also a demand for development of electronic products which have an increased number of functionalities and have increased electronic capabilities (e.g., increased speed, memory, and operational life). These trends have resulted in a demand for integrated circuits which enable these and other increased capabilities (e.g., increased density, computing power and extended operational life).

In particular, the foregoing trends and demand drive a need for integrated circuits which utilize superconducting materials and properties (so-called "superconducting integrated circuits"). Superconductor materials have substantially no electrical resistance below a certain critical temperature, which may provide for increased performance in integrated circuit devices. The foregoing trends and demand also drive a need for interconnects (or interconnect structures) which enable assembly of semiconductor structures including superconducting integrated circuits. As is known, a vertical interconnect access (or "via") is one example type of interconnect.

As is also known, superconducting integrated circuits are a leading candidate technology for large-scale quantum computing. Long coherence times compared to logic gate times are necessary for building a fault tolerant quantum computer. In the case of superconducting quantum bits (qubits), coherence time improvements are attributable to a number of design changes for specific superconducting materials.

One indicator of the coherence time of a superconducting quantum integrated circuit is intrinsic quality factor $Q_i$. Titanium nitride (TiN) superconducting coplanar waveguide (SCPW) resonators may be provided having high intrinsic quality factors $Q_i$. Although many studies have been done on qubits, a major technical challenge is the lack of existing high performance materials, which meet the stringent requirements of qubit applications. Such requirements include: providing materials having a high intrinsic quality factor, keeping a substantially stoichiometric thin film composition across a wafer, wafer-to-wafer reproducibility, and stability down to the milli-Kelvin temperature range in addition to the mandatory requirements of scalability.

SUMMARY

Described herein are concepts, systems, circuits and techniques related to shielded through via structures and methods for fabricating such shielded through via structures. The described shielded through via structures and techniques allow for assembly of multi-layer semiconductor structures including one or more superconducting semiconductor structures (or integrated circuits). In one aspect of the concepts described herein, a shielded through via structure includes.

One aspect of the concepts, circuits and techniques described herein is directed towards a cryogenic package which includes a superconducting and/or non-superconducting and/or partially superconducting silicon (Si) substrate, and one or more superconducting integrated circuits attached or otherwise coupled to the substrate by superconducting interconnects provided as under bump metals. The Si substrate may include at least one shielded and/or partially shielded through via filled/coated with multiple metal and/or material layers with at least one metal and/or material layer superconducting during system operation. At least one superconducting integrated circuit comprises a qubit and/or a resonator formed on high Q, low loss materials preferably operated at radio frequency (RF) and/or microwave frequency region.

Another aspect of the concepts, circuits and techniques described herein is directed towards a cryogenic package which includes a superconducting and/or non-superconducting and/or partially superconducting silicon substrate, and one or more superconducting integrated circuits attached or otherwise coupled to the substrate by superconducting and/or partially superconducting interconnects. The Si substrate may include at least one shielded and/or partially shielded through via filled/coated with multi-metal and/or material layers with at least one superconducting metal and/or material layer during system operation. The Si substrate and at least one superconducting integrated circuit may include a qubit and/or a resonator formed on high Q, low loss material preferably operated at radio frequency (RF) and/or microwave frequency region.

Still another aspect of the concepts, circuits and techniques described herein is directed towards a cryogenic package which includes a superconducting and/or non-superconducting and/or partially superconducting silicon substrate, and one or more superconducting integrated circuits attached or otherwise coupled to the substrate by superconducting and/or partially superconducting interconnects. The Si substrate may include at least one shielded and/or partially shielded through via filled/coated with multiple metal and/or material layers with at least one superconducting metal and/or material layer during system operation. The Si substrate and at least one superconducting integrated circuit may include a qubit and/or resonator formed on high Q, low loss material preferably operated at radio frequency (RF) and/or microwave frequency region.

Another aspect of the concepts, circuits and techniques described herein is directed towards a cryogenic package which include a superconducting integrated circuits attached or otherwise coupled to an MCM through an intermediate Si substrate with one or more superconducting and/or partially superconducting interconnects. The intermediate Si substrate may include at least one shielded and/or partially shielded through via filled/coated with multi metal and/or material layers with at least one superconducting layer during system operation. The Si substrate and/or at least one superconducting integrated circuit may include a qubit and/or resonator formed on high Q, low loss materials preferably operated at radio frequency (RF) and/or microwave frequency region.

Another aspect of the concepts, circuits and techniques described herein is directed towards a cryogenic package which includes a superconducting integrated circuits attached or otherwise coupled to an MCM through an intermediate Si substrate with one or more superconducting and/or partially superconducting interconnects. The Intermediate Si substrate may include at least one shielded and/or partially shielded through via filled/coated with multiple metal and/or material layers with at least one superconducting layer during system operation. The Si substrate and/or at least one superconducting integrated circuit may include a qubit formed on high Q, low loss resonators structures preferably operated at radio frequency (RF) and/or microwave frequency region. At least part of Low-loss superconducting integrated circuits and/or intermediate substrate use high Q metal and/or material shielding.

Another aspect of the concepts, circuits and techniques described herein is directed towards a cryogenic package which includes one or more superconducting integrated circuits attached or otherwise coupled with an MCM through an intermediate Si substrate with one or more superconducting and/or partially superconducting interconnects. The intermediate Si substrate may include at least one shielded and/or partially shielded through via filled/coated with multiple metal and/or material layers with at least one superconducting layer during system operation. The Si substrate and at least one superconducting integrated circuit may include a qubit and/or resonator formed on high Q, low loss resonators structures preferably operated at radio frequency (RF) and/or microwave frequency region. At least part of Low-loss superconducting integrated circuits and/or intermediate substrate use high Q metal and/or material shielding. At least part of the intermediate Si substrate may include deep etching just below one or more of the qubits and/or resonator area of the integrated circuits.

Another aspect of the concepts, circuits and techniques described herein is directed towards a cryogenic package which includes one or more superconducting integrated circuits attached or otherwise coupled with an MCM through an intermediate Si substrate with one or more superconducting and/or partially superconducting interconnects. The intermediate Si substrate may include at least one shielded and/or partially shielded through via filled/coated with multi metal layers with at least one superconducting layer during system operation. The Si substrate and at least one superconducting integrated circuit includes a qubit and resonator formed on high Q, low loss material preferably operated at radio frequency (RF) and/or microwave frequency region. At least part of Low-loss superconducting integrated circuits and/or intermediate substrate use high Q metal shielding. At least part of the intermediate Si substrate may include deep etching coated with high Q metal just below the qubit and/or resonator area of the integrated circuits.

Another aspect of the concepts, circuits and techniques described herein is directed towards a cryogenic package which includes one or more superconducting integrated circuits attached or otherwise coupled to an MCM through an intermediate Si substrate with one or more superconducting and/or partially superconducting interconnects. The intermediate Si substrate may include at least one shielded and/or partially shielded through via filled/coated with multi metal layers with at least one superconducting layer during system operation. At least part of the low-loss superconducting integrated circuits and/or intermediate substrate may include a deep Si etching coated with high Q metal and at least part of a qubit and resonator formed on high Q, low loss material preferably operated in radio frequency (RF) and/or microwave frequency region.

Another aspect of the concepts, circuits and techniques described herein is directed towards a cryogenic package which includes one or more superconducting integrated circuits attached or otherwise coupled to an MCM through an intermediate Si substrate with one or more superconducting and/or partially superconducting interconnects. The intermediate Si substrate may include at least one shielded and/or partially shielded through via filled/coated with multi metal layers with at least one superconducting layer during system operation. At least part of the low-loss superconducting integrated circuits and/or intermediate substrate may include a deep Si etching coated with a high Q metal and at least part of a qubit and/or resonator may be formed on high Q, low loss material preferably operated in the radio frequency (RF) and/or microwave frequency region.

Another aspect of the concepts, circuits and techniques described herein is directed towards a cryogenic package which includes one or more low loss superconducting integrated circuits attached or otherwise coupled to an MCM with one or more superconducting and/or partially superconducting interconnects. At least part of the low-loss superconducting integrated circuits and/or MCM may include a deep Si etching coated with high Q metal and at least part of a qubit and/or resonator formed on high Q, low loss material preferably operated in the radio frequency (RF) and/or microwave frequency region.

Another aspect of the concepts, circuits and techniques described herein is directed towards a cryogenic package which includes one or more low loss superconducting integrated circuits attached or otherwise coupled to an MCM through an intermediate Si substrate via one or more superconducting and/or partially superconducting interconnects. The intermediate Si substrate may include at least one shielded and/or partially shielded through via filled/coated with multiple metal and/or material layers with at least one superconducting layer during system operation. The Si substrate and at least one superconducting integrated circuit may include a qubit and resonator formed on high Q, low loss resonators structures preferably operated at radio frequency (RF) and/or microwave frequency region. At least part of the low-loss superconducting integrated circuits and/or intermediate substrate may use high Q material shielding. At least part of the intermediate Si substrate may include an opening just below of qubit and/or resonator area of integrated circuits.

Another aspect of the concepts, circuits and techniques described herein is directed towards a cryogenic package which includes one or more superconducting integrated circuits attached or otherwise coupled to an MCM through an intermediate Si substrate with one or more superconducting and/or partially superconducting interconnects. The intermediate Si substrate may include at least one shielded and/or partially shielded through via filled/coated with multiple metal and material layers with at least one superconducting layer during system operation. The Si substrate and/or at least one superconducting integrated circuit may include a qubit and resonator formed on high Q, low loss resonators structures preferably operated in the radio frequency (RF) and/or microwave frequency region. At least part of the low-loss superconducting integrated circuits and/or intermediate substrate may use high Q metal shielding. The MCM and/or intermediate substrate and/or integrated circuits have at least one superconducting via.

Another aspect of the concepts, circuits and techniques described herein is directed towards a cryogenic package which may include one or more superconducting integrated circuits attached or otherwise coupled to an MCM through an intermediate Si substrate with one or more superconducting and/or partially superconducting interconnects. The intermediate Si substrate may include at least one shielded and/or partially shielded through via filled/coated with multiple metal and material layers with at least one superconducting layer during system operation. The Si substrate and at least one superconducting integrated circuit may include a qubit and/or resonator formed on high Q, low loss materials preferably operated in the radio frequency (RF) and/or microwave frequency region. At least part of the Low-loss superconducting integrated circuits and/or intermediate substrate use high Q metal shielding. The MCM and/or intermediate substrate and/or integrated circuits may have at least one superconducting trace and/or embedded/integrated resistors and/or capacitors and/or Inductors.

Another aspect of the concepts, circuits and techniques described herein is directed towards a cryogenic package which may include one or more low loss superconducting integrated circuits attached with MCM through an intermediate Si substrate with one or more superconducting and/or partially superconducting interconnects. Intermediate Si substrate may include at least one shielded and/or partially shielded through via filled/coated with multiple metal and/or material layers with at least one superconducting layer during system operation. The Si substrate and at least one superconducting integrated circuit may comprise a qubit and resonator formed on high Q, low loss material preferably operated at radio frequency (RF) and/or microwave frequency region. At least part of the low-loss superconducting integrated circuits and/or the intermediate substrate and/or the MCM may use Josephson Junction (JJ) based active and/or passive circuits.

Another aspect of the concepts, circuits and techniques described herein is directed towards a cryogenic package which may include one or more superconducting integrated circuits attached with MCM through an intermediate Si substrate with one or more superconducting and/or partially superconducting interconnects. Intermediate Si substrate may include at least one shielded and/or partially shielded through via filled/coated with multi metal layers with at least one superconducting layer during system operation. The Si substrate and at least one superconducting integrated circuit may include a qubit formed on high Q, low loss resonators structures preferably operated in the radio frequency (RF) and/or microwave frequency region. At least part of the low-loss superconducting integrated circuits and/or intermediate substrate and/or MCM may use Josephson Junction (JJ) based active and/or passive circuits. At least one superconducting integrated circuit and/or intermediate substrate and/or MCM include dielectric bridges and/or crossovers.

In one aspect of the disclosure, a shielded through via based electronic package includes a superconducting integrated circuit having first and second opposing surfaces. Each of the first and second opposing surfaces has a first circuit including a plurality of electrical conductors disposed thereon. The shielded through via based electronic package also includes a superconducting and/or a partially superconducting circuitized substrate having first and second opposing surfaces. Each of the first and second opposing surfaces has a second circuit including a plurality of electrical conductors disposed thereon.

The shielded through via based electronic package additionally includes an interposer disposed substantially between the superconducting integrated circuit and the superconducting and/or partially superconducting circuitized substrate. The interposer electrically interconnects the superconducting integrated circuit and said superconducting and/or partially superconducting circuitized substrate using a superconducting and/or a partial superconducting interconnect. Additionally, the interposer electrically interconnects select ones of the electrical conductors of the first circuit with corresponding select ones of the electrical conductors of the second circuit. The interposer further includes at least one through shielded via. The at least one through shielded via is coated with, filled with, or partially filled with a high quality factor material composition. Additionally, the shielded through via is electrically coupled to the select ones of the electrical conductors of the first circuit and to the select electrical conductors of the second circuit by the interposer.

The shielded through via based electronic package may also include one or more of the following features individually or in combination with other features. At least one of: a resonator, a Josephson junction, a qubit, an inductor, a capacitor, and a bias line disposed between the interposer and the superconducting integrated circuit and electrically and/or inductively and/or capacitively coupled to the integrated circuit. The at least one shielded through via may further include: at least one oxide layer and/or nitride layer and/or low loss polymer layer. The at least one oxide layer and/or nitride layer and/or polymer layer may be formed prior to the at least one through via being coated with, filled with, or partially filled with the high quality factor material.

The at least one shielded through via may be formed through at least one of: a physical vapor deposition (PVD), chemical vapor deposition (CVD), a sputtered, a magnetron sputtered, a reactive sputtered, an atomic layer deposition (ALD), a pulsed laser deposition (PLD), a plasma enhanced, and a Inductive plasma (IMP) process. The shielded through via based electronic package may further include: at least one of a: resonator, a Josephson junction, a qubit, an inductor, a capacitor, a resistor, and a bias line disposed between the second circuit and the interposer and electrically and/or inductively and/or capacitively coupled to the superconducting integrated circuit.

The interposer may include at least one shielded area, the at least one shielded area including single or multiple through vias. The single or multiple through vias may include a substantially low stress high quality factor material composition. The at least one through via may be filled and/or partially filled with at least one of an evaporated metal, a sputtered metal and a plated metal. The interposer may include partially and/or fully etched silicon (Si) and at least one through via having first and second opposing portions. The shielded through via electronic package may further include: first and second pluralities of conductive pads located on the first and second opposing portions of the at least one through via. The shielded through via electronic package may further include: at least one of: a resonator, a Josephson junction, a qubit, an inductor, a capacitor, and a bias line disposed between the etched Si surface of the interposer and the superconducting integrated circuit and electrically and/or inductively and/or capacitively coupled to the integrated circuit. The interposer may include partially and/or fully etched silicon which acts as a spacer.

In another aspect of the concepts described herein, a shielded through via structure includes a substrate having first and second opposing surfaces. The shielded through via structure also includes a first shielding portion formed or otherwise provided in a first selected portion of the substrate. The first shielding portion includes a first insulating layer having first and second opposing surfaces and at least one side. The first shielding portion also includes a first oxide layer disposed over at least one of the first and second opposing surfaces and the at least one side of the first insulating layer. The first shielding portion additionally includes a first conductive layer disposed over selected portions of the first oxide layer.

The shielded through via structure also includes a second shielding portion formed or otherwise provided in a second selected portion of the substrate. The shielded through via structure additionally includes a through via structure formed or otherwise provided in one or more openings formed in the substrate. The substrate openings are spaced between the first and second selected portions of the substrate in which the first and second shielding portions are provided. Additionally, the through via structure includes a first interconnect pad having first and second opposing surfaces. The first surface of the first interconnect pad is disposed over a first selected portion of the first surface of the substrate proximate to a first end of a first selected one of the substrate openings.

The through via structure also includes a second interconnect pad having first and second opposing surfaces. The first surface of the second interconnect pad is disposed over a first selected portion of the second surface of the substrate proximate to a second opposing end of the first selected one of the substrate openings. The through via structure additionally includes a first through via disposed between the first and second ends of the first selected one of the substrate openings and extending between the first and second surfaces of the substrate. The first through via has first and second opposing portions. The first portion of the first through via is electrically coupled to the first surface of the first interconnect pad. Additionally, the second portion of the first through via is electrically coupled to the first surface of the second interconnect pad.

The shielded through via structure may also include one or more of the following features individually or in combination with other features. The second shielding portion may be substantially similar to the first shielding portion. The second shielding portion may include a second insulating layer having first and second opposing surfaces and at least one side. Additionally, the second shielding portion may include a second oxide layer disposed over at least one of the first and second opposing surfaces and the at least one side of the second insulating layer. Further, the second shielding portion may include a second conductive layer disposed over selected portions of the second oxide layer.

The second oxide layer of the second shielding portion may have a first portion disposed over the first surface of the second insulating layer. Additionally, the second oxide layer may have a second portion disposed over the second surface of the second insulating layer. Further, the second oxide layer may have a third portion disposed over the at least one side of the second insulating layer. The second conductive layer of the second shielding portion may have a first portion disposed over the first portion of the second oxide layer. Additionally, the second conductive layer may have a second portion disposed over the second portion of the second oxide layer. Further, the second conductive layer may have a third portion disposed over the third portion of the second oxide layer.

The through via structure may include a third interconnect pad having first and second opposing surfaces. The first surface of the third interconnect pad may be disposed over a second selected portion of the first surface of the substrate proximate to a first end of a second selected one of the substrate openings. The through via structure may also include a fourth interconnect pad having first and second opposing surfaces. The first surface of the fourth interconnect pad may be disposed over a second selected portion of the second surface of the substrate proximate to a second opposing end of the second selected one of the substrate openings. The through via structure may additionally include a second through via disposed between the first and second ends of the second selected one of the substrate openings and extending between the first and second surfaces of the substrate, wherein the second through via has first and second opposing portions. The first portion of the second through via may be electrically coupled to the first surface of the third interconnect pad. Additionally, the second portion of the second through via may be electrically coupled to the first surface of the fourth interconnect pad.

The first selected one of the substrate openings may be proximate to the first shielding portion. The second selected one of the substrate openings may be proximate to the second shielding portion. A thickness of the substrate may be selected to provide a predetermined amount of electrical isolation. The substrate thickness may correspond to a distance between the first and second surfaces of the substrate.

The through via structure may include a third interconnect pad having first and second opposing surfaces. The first surface of the third interconnect pad may be disposed over a second selected portion of the first surface of the substrate proximate to a first end of the first selected one of the substrate openings. The through via structure may also include a fourth interconnect pad having first and second opposing surfaces. The first surface of the fourth interconnect pad may be disposed over a second selected portion of the second surface of the substrate proximate to the second end of the first selected one of the substrate openings. The through via structure may additionally include a second through via disposed between the first and second ends of the first selected one of the substrate openings and extending between the first and second surfaces of the substrate. The second through via may have first and second opposing portions. The first portion of the second through via may be electrically coupled to the first surface of the third interconnect pad. Additionally, the second portion of the second through via may be electrically coupled to the first surface of the fourth interconnect pad. The through via structure may further include a cavity formed between the first through via and the second through via.

The substrate may be provided as a polymer. The first insulating layer may include one or more electrically insulating materials. The electrically insulating materials may include at least one of silicon (Si) and glass. The first conductive layer may include one or more electrically conductive materials. The electrically conductive materials may include at least one of niobium (Nb), indium (In), gold (Au), copper (Cu), titanium (Ti), titanium nitride (TiN).

BRIEF DESCRIPTION OF THE DRAWINGS

Features and advantages of the concepts, systems, circuits and techniques disclosed herein will be apparent from the following description of the embodiments taken in conjunction with the accompanying drawings in which.

DETAILED DESCRIPTION

Figure 1:
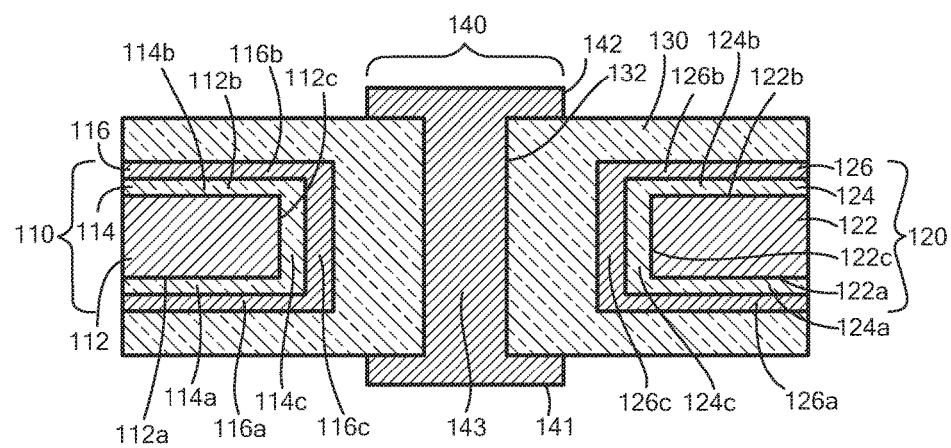
FIGS. 1-1B show cross-sections of example shielded through via structures as may be formed in accordance with an embodiment of the disclosure.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views. It should, of course, be appreciated that elements shown in the figures are not necessarily drawn to scale. For example, the dimensions of some elements may be exaggerated relative to other elements for clarity.

Definitions

For convenience, certain introductory concepts and terms used in the specification are collected here.

As used herein, a "high Q metal" or "high Q material" (or so-called high Q metals or "high Q materials") refers to materials in the 20-400 nm film form capable of producing a high quality factor and are defined as materials in a resonator and/or a superconducting resonator which produce a quality factor in the range of about a few thousands to several millions in the low power and/or single photon region. Illustrative materials include, but are not limited to: niobium (Nb), niobium nitride (NbN), titanium-niobium-nitride (TiNbN), titanium nitride (TiN), aluminum (Al), and rhenium (Re), diamond, graphine etc.

The phrase "quality factor" can be used to describe how long stored energy remains in a resonator. It should be appreciated that there is a difference between a total quality factor and an internal quality factor Qi. Internal quality factor Qi is an intrinsic characteristic of a resonator. A total or loaded quality factor QL, on the other hand, also depends upon other properties, including, but not limited to, coupling to an environment (i.e. an environment external to the resonator) and a feedline. A coupling quality factor (Qc) describes how strong (or closely) the resonator is coupled to the feedline.

As used herein, the term "resonator" refers to a device or system that exhibits resonance at some frequencies. A resonator may be described by two characteristics: (1) a resonance frequency; and (2) a quality factor. Superconducting resonators play a significant role in qubit design, interqubit coupling, quantum information storage, and quantum-state dispersive readout because of their low signal-to-noise ratio and low power dissipation. In addition, as part of the concepts sought to be protected herein, it has been recognized that because superconducting qubits may be fabricated using the same materials and processes as resonators described herein, the study of the loss mechanisms limiting the qualify factor Q in these resonators may prove to be a useful and relatively simple tool for understanding the fabrication-dependent limits to qubit coherence times. Superconducting resonator is provided as any type of microwave resonator, including distributed—e.g., a coplanar waveguide (CPW) resonator, stripline resonator, microstrip resonator, coplanar strip resonator, puck resonator, and related structures,—and lumped element resonators comprising lumped capacitive and inductive elements coupled in parallel and/or in series, the capacitor formed by patterning a conductive layer deposited on a surface of a substrate A bit is the most basic unit of classical logic and can occupy one of two discrete states, 0 or 1. A quantum bit, or 'qubit,' on the other hand, can be an arbitrary superposition of the eigenstates |0> and |1>. A quantum computer is comprised of logic gates that operate on an ensemble of quantum bits.

Where n classical bits can only exist in one of the 2n possible states, a quantum processor with n qubits can be placed in a complex superposition state of any weighted combinations of all 2n permutations, containing exponentially larger state space than a conventional processor.

"Superconducting qubits" are manifested as (e.g. an integrated circuit) electronic circuits comprising lithographically defined Josephson junctions, inductors, capacitors, transmission lines and interconnects. When cooled to dilution refrigerator temperatures, these circuits behave as quantum mechanical "artificial atoms," exhibiting quantized states of electronic charge, magnetic flux, or junction phase depending on the design parameters of the constituent circuit elements. The Josephson junction behaves as a non-linear dissipationless inductor.

Superconducting qubits are engineered to have discrete and harmonic spectra—an "artificial atom" fabricated using standard lithographic techniques.

"Superconducting artificial atoms" are electronic circuits comprising lithographically defined Josephson tunnel junctions, inductors (L), capacitors (C), and interconnects. Conceptually, they begin as linear LC resonant circuits (i.e., simple harmonic oscillators), which are then made anharmonic to varying degrees by adding a nonlinear inductive element, the Josephson junction (JJ). When cooled to dilution refrigerator temperatures (~20 millikelvin), these superconducting circuits behave as quantum mechanical oscillators (e.g., "artificial atoms") exhibiting quantized states of electronic charge, magnetic flux, or junction phase depending on the design parameters of the constituent circuit elements.

A superconducting IC or device as defined herein may include devices which may be comprised of at least a superconducting trace and/or superconducting interconnect and/or a partially superconducting interconnect and/or a Josephson junction and/or a superconducting qubit and/or circuit which functions as a superconducting resonator during operation.

Three fundamental superconducting qubit modalities are: charge, flux, and phase. Each includes one or more Josephson junctions. The qubit comprises the two-lowest states and is addressed at a unique frequency, $f_{01}$. Qubit modalities represented include charge, quantronium, flux, capacitively shunted flux, 2D transmon, fluxonium, and 3D transmon qubits.

The term "superconducting qubit" generally refers to the ground and first-excited state of a superconducting artificial atom. Due to the anharmonicity imparted by the Josephson junction, the ground and first-excited states may be uniquely addressed at a frequency, $f_{01}$, without significantly perturbing the higher-excited states of the artificial atom. These two-lowest states thereby form an effective two-level system (i.e., a pseudo-"spin-1/2" system), and it is this degree of freedom that is used as the qubit, a quantum bit of information. Qubit participates in quantum annealing cycle and settle into one of two possible final states (0,1). Qubit used real valued constant (weight) which influences qubit's tendency to collapse into two possible final states.

The term "coupler" as used herein refers to a physical device that allows one qubit to influence another qubit. An Inductor and/or a Josephson junction can be a part of coupler. A coupler may be characterized by a real valued constant (strength) that indicates control or influence exerted by one qubit on another. A coupler includes a qubit and/or resonator and/or Josephson junction and/or inductor and/or capacitor.

As quantum mechanical objects, superconducting qubits can be coherently controlled, placed into quantum superposition states, exhibit quantum interference effects, and become entangled with one another. The time scale over which a superconducting qubit maintains this type of quantum mechanical behavior, and thereby remains viable for quantum information applications, is generally called the "coherence time." The rate at which the qubit loses coherence is related to its interactions with the uncontrolled degrees of freedom in its environment.

The term "interposer" as used herein, refers to and includes any structure capable of electrically interconnecting and/or magnetically and/or inductively and/or capacitively coupling arrays of superconducting conductors on two opposing circuitized substrates using extremely small superconductive and/or partially superconductive elements such as micro-bumps, solder paste or conductive paste, as well as by using conductive and/or superconductive thru-holes. Such an interposer, as defined herein, includes at least one dielectric layer (and may include many) and at least two external superconductive circuit layers (and possibly one or more internal superconductive circuit layers) wherein the layers may each include selective and/or a density array of contact locations. Examples of dielectric materials include such materials as high resistive silicon, silicon oxide coated Si, silicon nitride coated Si, selective silicon oxide coated Silicon, selective silicon nitride coated Silicon, selective or entire low loss organic (e.g., BCB) coated Silicon and combination.

Examples of filled and or partially filled conductive and/or superconductive thru-holes as defined herein include materials as niobium (Nb), niobium nitride (NbN), titanium-niobium-nitride (TiNbN), titanium nitride (TiN), aluminum (Al), rhenium (Re), tungsten, silicide, diamond or any other possible superconducting metal and/or superconducting nitride and combination. In one example, conductive and/or superconductive thru-holes as defined herein include at least single and/or multilayer Titanium nitride where part of the Titanium nitride can be used as Silicon and titanium etch barrier. It is further possible to use titanium nitride single and/or multilayer materials with multiple composition and/or concentration gradient where at least one composition and/or concentration is superconducting during device operation. In one example, conductive and/or superconductive thru-holes are filled with a metal (e.g., a conventional metal) and/or solder and/or a superconducting metal and/or superconducting nitrides and/or conformal polysilicon and/or insulators to minimize via stress, wafer bow and warpage.

The term "superconducting multi-chip module (SMCM)" as used herein includes at least one dielectric layer (and may include many) and at least one superconductive circuit layers (and possibly one or more internal superconductive circuit layers) deposited on the base substrate (e.g. Si or high resistive Si) using thin film technology. It is further possible to include one superconductive via and/or superconducting pad wherein the superconducting pad containing under bump metals. Examples of dielectric materials include such materials as silicon (Si), high resistive silicon, silicon oxide as dielectric on Si, silicon nitride as dielectric on Si, selective silicon oxide on Silicon, selective silicon nitride on Silicon, selective or entire low loss organic (e.g., BCB) coated Silicon and combination.

Examples of superconductive circuits, vias and pads as defined herein include materials as niobium (Nb), niobium nitride (NbN), titanium-niobium-nitride (TiNbN), titanium nitride (TiN), aluminum (Al), rhenium (Re), or any other possible superconducting metal and/or superconducting nitride and combination. A substrate may have a Josephson junction and/or an embedded Josephson junction. It is further possible to use integrated and/or embedded capacitors, inductors, resistors. Patterned NbN can act as inductor. Capacitor may be planer, parallel plate, interdigitate and combinations thereof. Examples of materials from which resistors may be provided include, but are not limited to: platinum, molybdenum, molybdenum nitride and combinations thereof. The substrate can further have dielectric bridges, crossovers, air bridges and combinations. The term "superconducting multi-chip module (SMCM)" may be used when at least part of the circuits are superconducting during operation and used superconducting and/or normal via between superconducting circuits for interconnects.

A substrate is a carrier structure. For example, a substrates may correspond to a chip carrier for flip-chip and/or wire bonding and/or three-dimensional (3D) circuits. A substrate can be an active and/or passive integrated circuit based carrier. A substrate may be provided as an active and/or passive TSV and/or MCM and/or single chip module based carrier. A chip carrier can be silicon (Si) based or organic based or ceramic based or Sapphire based or a combination of any of the above.

Superconducting multi-chip module (SMCM) can have normal UBM conductor for heterogeneous integration as well as to protect the superconducting pad. We defined "superconducting multi-chip module (SMCM)" when at least part of the circuit is normal conductor and part of superconducting during operation. Superconducting multi-chip module (SMCM) can have active element such as various size Josephson junctions and passive elements such as inductors, resistors, transformers, and transmission lines. In one example, Superconducting multi-chip module (SMCM) is a niobium-based integrated-circuit fabrication process appropriate for integrating superconducting chips. It is based on four Nb metal layers separated by PECVD silicon oxide dielectric. It utilizes I-line (365 nm) photolithography and planarization with chemical-mechanical polishing (CMP) for feature sizes down to 0.8 micron. There are four superconducting Nb layer and used Ti—Pt—Au as under bump metal layer.

Superconducting vias are created between metal layers. In a typical process, vias are etched into PECVD $SiO_2$ dielectric and filled with niobium metal of the subsequent superconducting layer. Superconducting multi-chip module (SMCM) may be used to assemble multiple superconducting and/or normal chips. Similarly, superconducting single-chip module (SSCM) may be used to assemble a single superconducting or normal chip. The term "superconducting module" or "superconducting substrate" includes both superconducting multi-chip module (SMCM) and superconducting single-chip module (SSCM). We use the term "normal module" or "normal substrate" which includes both multi-chip module (MCM) and single-chip module (SCM). Both superconducting and normal module able to attach superconducting and/or normal conducting chips.

We defined "cryogenic electronic packaging" as integration and packaging of electronic components for cryogenic (77° K and below) applications. It is possible cryogenic electronic package can be used for room temperature electronics as well. For example interface electronics which needs to interface between cryo and room temperature electronics able to operate at both temperature zone. It also possible that cryogenic electronic package can be used for specific temperature operation (e.g., 4-10° K, below 100° m K). For example superconducting niobium electronics generally operate below about 8° K, whereas superconducting Aluminum electronics generally operate below about 500° mK.

The term "under bump metal (UBM)" or "under bump metallization (UBM)" as used herein refers to structures which include materials which provide a low resistance electrical connection to the superconducting pad. A UBM may adhere well both to the underlying superconducting pad and to the surrounding superconducting circuits passivation layer, hermetically sealing the superconducting circuits from the environment. In some cases, a UBM may provide a strong barrier to prevent the diffusion of other bump metals into the superconducting circuits.

A top layer of a UBM must be readily wettable by the bump metals, for solder reflow. In one embodiment a UBM uses multiple different metal layers, such as an adhesion layer, a diffusion barrier layer, a solderable layer, and an oxidation barrier layer. It is further possible that the UBM layers are compatible metals which in combination have low internal mechanical stresses. Example of materials from which a UBM may be provided include, but are not limited to: 20 nm Ti-50 nmPt-150 nmAu, 10 nmTi-50 nm Au, 5 nm Ti-5 nm Pt-5 nm Au-1000 nm Indium, 5 nm Ti-5 nm Pt-5 nm Au-1000 nm Sn, 50 nm Pt-100 nm Au, 5 nm Ti-500 nm In, 20 nm Ti-1000 nm In, Ni—Au, Ni—Pd—Au, Pd—Au, Ti—TiN, Ti—TiN—Ti—Au, Ti—TiN—Ti—In, Ti—TiN—Ti—Sn, Ti—Sn—In etc.

The term "superconducting interconnect" or "partially superconducting interconnect" as used herein refers to structures including at least one superconducting bump and at least one UBM to create electrical and/or mechanical connection between two superconducting circuits. We defined "superconducting interconnect" when superconducting bump and superconducting UBM create superconducting interconnect between two superconducting circuits during operation. We also defined "superconducting interconnect" when superconducting bump and normal UBM conductor create superconducting interconnect between two superconducting circuits during operation. Here normal UBM conductor become superconducting due to proximity effect. Examples of superconducting interconnects include but are not limited to: (10-400)nm Al-(3-20)nm Ti-(5-40)nm Au-(1-5)μm In-(5-40)nm Au-(5-20)nm Ti-(10-400)nm Al. Here Al is used as superconducting pad, Ti—Au or Ti—Au-thin (1000 nm) Indium can act as UBM. It is possible in the final interconnect part of Au thickness will be consumed by Indium and rest of the Au will superconducting based on proximity. Few other example of superconducting interconnects: (10-400)nm Al-(3-20)nm Ti-(1-5)μm In-(5-20)nm Ti-(10-400)nm Al, (10-400)nm Al-(1-5)μm In-(10-400)nm Al, (10-400)nm Al-(3-20)nm Ti-(5-40)nm Au-(1-5)μm In-(1-5) μm Sn-(5-40)nm Au-(5-20)nm Ti-(10-400)nm Al, (10-400) nm Nb-(3-20)nm Ti-(5-40)nm Au-(1-5)μm In-(5-40)nm Au-(5-20)nm Ti-(10-400)nm Nb, (10-400)nm Nb-(3-20)nm Ti-(1-5)μm In-(5-20)nm Ti-(10-400)nm Al, (10-400)nm Nb-(1-5)μm In-(10-400)nm Nb, (10-400)nm Al-(3-20)nm Ti-(5-40)nm Au-(1-5)μm In-(1-5)μm Sn-(5-40)nm Au-(5-20)nm Ti-(10-400)nm Al, (10-400)nm Al-(3-20)nm Ti-(5-200)nm TiN-(1-5)μm In-(5-200)nm TiN-(5-20)nm Ti-(10-400)nm Al, (10-400)nm Al-(3-20)nm Ti-(5-200)nm TiN-(5-40)nm Au-(1-5)μm In-(5-40 nm) Au-(5-200)nm TiN-(5-20)nm Ti-(10-400)nm Al, (10-400)nm Nb-(3-20)nm Ti-(5-200)nm TiN-(1-5)μm In-(5-200)nm TiN-(5-20)nm Ti-(10-400)nm Nb, (10-400)nm Nb-(3-20)nm Ti-(5-200)nm TiN-(5-40)nm Au-(1-5)μm In-(5-40 nm) Au-(5-200)nm TiN-(5-20)nm Ti-(10-400)nm Al, and combinations of the above.

We defined "partially superconducting interconnect" when superconducting bump and normal UBM conductor create normal conductor interconnect between two superconducting circuits during operation. Here normal UBM conductors dominate interconnect conductance although part of the interconnect is superconducting due to superconducting bump. In one example superconducting interconnect use as Al-UBM-Indium-UBM-Al or Nb-UBM-In-UBM-Nb. Examples of initial interconnect composition prior to bonding with second superconducting substrate include, but are not limited to: Ti(5 nm)-Au(20 nm)–8 um In, Ti(5 nm)-Au (100 nm)–8 um In, Ti(5 nm)-Au(50 nm)–8 um In, Ti(5 nm)/Pt(20 nm)/Au(20 nm)+8 um In, Ti(5 nm)/Pt(20 nm)/Au(20 nm)+8 um In, Ti(5 nm)/Pt(50 nm)/Au(100 nm)+8 um In, Ti(5 nm)/Pt(50 nm)/Au(150 nm)+8 um In, 8 um Indium-1 um tin, 4.5 um Indium-4.5 um tin, 6 um Silver bump with 2 um In, 5 nmTi-6 um Ag-5 nmTi-50 nmPt-100 nmAu-2 um In, Al—In, Pb—In, Pb—Ti—In, Pb—Sn—In, Pb—Sn—In—Au(10 nm). Nb—Pb—Sn—In, Nb—Pb—In, Nb—Ti(5 nm)-Pb(8 um)-In(2-5 um), 48Sn-52In etc. In one example, a total interconnect resistance for an Al based superconducting substrate may be calculated as: interface resistance of Al-UBM+interface resistance of (UBM-In)+ interface resistance of (In-UBM)+interface resistance of UBM-Al.

In this example, it is assumed that an Al pad is used for both superconducting integrated circuits and/or modules for creating superconducting and/or partially superconducting interconnects, assuming UBM resistance negligible in the range of nano ohm and Indium, aluminum superconducting during device operation. R(Al-UBM):contact resistance and R(UBM-In):interface resistance between bump and UBM. If Indium is used as a material from which to provide a UBM, then a Total Resistance (TR) may be computed as TR=2R (Al-UBM) assuming Indium to indium mixing much better and indium is superconducting. In this case, a contact resistance [R(Al-UBM)] will be superconducting due to proximity. So, keeping same materials as UBM as well as bump has many benefits other than adding multiple materials.

A Josephson junction is defined as two superconductors allowed interacting through a so-called "weak link," where the "weak link" may be provided from a thin insulating barrier, a normal metal, or a narrow superconducting constriction—respectively referred to as an S-I-S, S-N-S, or S-C-S junction. A supercurrent flows/tunnels through this weak link, even in the absence of a voltage. The critical current of the junction is related to the superconducting gap of the electrode materials as well as the type and thickness of the insulating barrier. It is often characterized by a critical current density Jc and the area A of the junction such that Ic=Jc×A.

Josephson tunnel junctions are formed by two superconducting electrodes separated by a very thin (~1 nm) insulating barrier. In this configuration, the collective superconducting order of one electrode (parameterized by a phase $\varphi_1$) coherently connects with that of the other electrode ($\varphi_2$) via the elastic tunneling of Cooper pairs through the barrier. The resulting supercurrent, I, and junction voltage, V, are related to the superconducting phase difference, $\varphi=\varphi_1-\varphi_2$, across the junction A circuit quantum electrodynamics (circuit QED) may be used to address and measure a superconducting qubit. Circuit QED, superconducting qubits coupled to the electric field in a planar transmission line resonator. For cavity QED an atom in the cavity interacts with the trapped photons, and a measurement of the photons leaking out of the cavity allows one to probe the state of the atom.

In Circuit QED, the cavity is replaced by a $\lambda/2$ transmission line resonator that interacts with the outside world via two capacitors, Cin and Cout. A superconducting qubit sits at a voltage anti-node in the resonator, where the capacitance between the qubit and the resonator sets the interaction strength. Measurements may determine a maximum number of photons leaking out of the resonator (RFout) when the impinging signal (RFin) is on or near resonance with the resonator-qubit system.

Superconducting quantum interference device (SQUID) may be provided from a superconducting loop interrupted by two Josephson junctions. The net critical current of the SQUID can be tuned by threading a magnetic flux through the loop. SQUID is a tunable Josephson junction, and this feature is used to make "tunable" superconducting qubits, i.e., qubits with a parameter related to the junction Ic that is tunable by the magnetic field that threads the SQUID loop.

As used here, the term "chemically activated surface" is used to describe a surface which is minimally etched and/or damaged. The hydrophilicity or hydrophobicity of the surface may be changed with appropriate plasma and/or chemical treatment by changing or modifying surface chemistry.

As used herein, the term "circuitized substrate" is used to describe a semiconductor structure including at least one dielectric layer, the at least one dielectric layer having at least one surface on which at least one circuit is disposed. Examples of dielectric materials suitable for the at least one dielectric layer include low temperature co-fired ceramic (LTCC), ceramic (alumina), fiberglass-reinforced or non-reinforced epoxy resins (sometimes referred to simply as FR4 material, meaning its Flame Retardant rating), polytetrafluoroethylene (Teflon), polyimides, polyamides, cyanate resins, photoimagable materials, and other like materials, or combinations thereof. Examples of electrically conductive materials suitable for the at least one circuit include copper and copper alloy. If the dielectric layer is provided from a photoimagable material, it is photoimaged or photopatterned, and developed to reveal the desired circuit pattern, including the desired opening(s) as defined herein, if required. The dielectric layer may be curtain coated or screen applied, or it may be supplied as a dry film or in other sheet form.

As used herein, the term "conductive fusible metal" is used to describe a metal including one or more of tin-lead, bismuth-tin, bismuth-tin-iron, tin, indium, indium-silver-lead, indium-lead (In—Pb), Indium-lead-tin (In—Pb—Sn), tin-indium, indium-gold, tin-indium-gold, tin-silver, tin-gold, indium, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. The metals may change forms (e.g., from a solid to a liquid) during a bonding or during post bonding annealing or reflow process.

As used herein, the term "conductive structure" is used to describe an interconnect structure for electrically coupling one or more interconnect pads, electrical connections, components, devices, modules, and semiconductor structures and devices. The conductive structure may include at least one of a micro via having a diameter which is between about one micrometer (μm) and about one-hundred fifty μm's and a sub-micron via having a diameter of less than about one μm.

As used herein, the term "spacer" refers to a structure used to control spacing between various other structures (e.g. between a chip and a chip carrier) and/or which may protect a chip during flip-chip bonding and/or self-aligned marking. In one example, a gold or aluminum wire may act as a spacer to control an indium bump height during a flip-chip bonding process. In another example, a gold or aluminum wire may be used to provide a 3D wall to isolate a specific device. 3D wall isolation may use dielectric bridges. Aluminum wire may be used to provide a superconducting 3D wall. It is possible to utilize aluminum and/or gold wire for a spacer as well as an inductor or an inductive element. A spaced may also be provided as a 3D transmission line and/or a spiral and/or a solenoid inductor. A spacer may include at least one of a silicon, deposited silicon, etched silicon, high resistive etched silicon, oxide coated silicon, silicon dioxide, glass, etched and/or deposited silicon nitride, annealed oxide, oxide etched recrystallized silicon, aluminum oxide, metal based spacer and combinations. A spacer may be able to control chip to chip spacing within a predetermined tolerance (e.g. 1 μm tolerances) with appropriate bonding cycles.

As used herein, the term "via first" may be used to describe a micro via and/or a submicro via used to make at least one electrical connection between a first device layer and second device layer in a semiconductor structure including at least two device layers. Additionally, as described here, the term "via" first may also be used to describe a micro via and/or a submicro via passing through a dielectric material or layer (in some embodiments, only the dielectric material or layer) to make at least one electrical connection between a first device layer and a second device layer in a semiconductor structure including at least two device layers. For a via first process, the first device layer and the second device layer are completed separately. As one example, a partial via material is added on first and/or second opposing surfaces (i.e., top and/or bottom surfaces) of the first second device layers and subsequent bonding and/or post bonding process create a via first between the first and second device layers.

The via first may be filled with at least one metal or alloy having a high Coefficient of Thermal Expansion (CTE) to produce a rigid, robust, and conductive via first joint between the at least two device layers during the composite bonding process. High temperatures and/or high pressures may be applied and used to bond the two device layers and provide a three-dimensional (3D) interconnection (i.e., interconnect) among the device layers. The high CTE metal or alloy are expanded at relatively high temperatures and interdiffuse with each other to produce the 3D interconnect. Alternatively, the via first may be filled with a low temperature fusible metal which melts and interdiffuse during bonding or post bonding processes.

As used herein, the term "via last" is used to describe a micro via and/or a submicro via used to make at least one electrical connection between a first device layer and a second device layer in a semiconductor structure including at least two device layers. Fabrication of the first device layer is completed first, and the second device layer is deposited over the first device layer. The second device layer is completed with via last process. A pad layer which includes one or more interconnect pads may be added after via last process. In one embodiment, via last is filled. Additionally, in one embodiment, the via last can be unfilled or partially filled. Via last may pass through the device layers (e.g., second device layers) and, in some embodiments, one or more isolation layers or materials. A titanium (Ti) material having a thickness of about ten nanometers (nm) and, a metal organic chemical vapor deposition (MOCVD) Titanium Nitride (TiN) liner having a thickness of about five nm, and tungsten plugs may be used for via lasts. A MOCVD or chemical vapor deposition (CVD) $TiN_X$, with X less than or equal to 1, is preferred for better conformal coating.

As used herein, the term "through via" is used to describe a vertical interconnect which passes substantially through an Si and/or glass and/or organic and/or hybrid substrate. A through via be fabricated by using any one of a variety of methods and approaches (e.g., wet chemical, dry etching, laser drilling, mechanical drilling and combination).

As used herein, the term "through silicon via" (TSV) is used to describe a vertical interconnect which passes substantially through one or more of a silicon wafer, a silicon die, a silicon interposer, silicon active circuits, silicon passive circuits, or other silicon circuits, components or layers. TSVs can be fabricated by a wide variety of different methods and approaches. In Silicon (Si) via-first approaches, for example, TSVs are fabricated prior to fabrication of active devices (i.e. bipolar or MOSFET devices) to which the TSVs may be coupled. The approach includes patterning the TSVs, lining the TSVs with a high temperature dielectric (thermal oxide or chemical vapor deposition), filling the TSVs with doped polysilicon and using chemical mechanical polishing (CMP) techniques to remove excess polysilicon from one or more surfaces of the TSVs. Si via-first approaches allow for the use of high temperature processes to insulate and fill the TSVs.

In Si via-middle approaches, TSVs are fabricated after forming the active devices to which the TSVs may be coupled, but before back end of line (BEOL) stack fabrication. The approach includes patterning the TSVs after a contact process, lining the TSVs with a low temperature dielectric deposition, and then filling the TSVs with single/multiple barrier metals. Typically the TSVs are filled with Copper (Cu) and/or W. For TSVs filled with Cu, a Cu seed layer is disposed on top of a barrier layer and a subsequent Cu electroplating fills the TSVs. The TSVs are then planarized using CMP techniques. For W, chemical vapor depositing (CVD) processes are used to fill the TSVs, and CMP techniques are used to remove excess polysilicon from one or more surfaces of the TSV. W is preferred for filling high aspect ratio TSVs (e.g., TSVs with aspect ratio of height-to-width>10:1). In general, Cu is used to fill low aspect ratio TSVs (e.g., TSVs with aspect ratio<10:1). Si via-middle process are useful for fabricating TSVs with a small via pitch, TSVs having minimal blockage of wiring channels, and TSVs having a low via resistance, for example.

In front side Si via-last approaches, TSVs are fabricated at the end of the BEOL processing of the wafer. Si via-last approaches are similar to Si via middle approaches, but Si via-last approaches use low temperature dielectric depositions (<400C) compared to higher temperature dielectric compositions (<600C) in Si via middle approaches. Front side Si via-last approaches may be suitable for their coarse TSV feature size, which simplifies the process of integrating TSVs into semiconductor structures. The front side Si via-last approaches may also useful for wafer-to-wafer bonding. In such approaches, TSVs can be formed at the end of the wafer-to-wafer bonding process, connecting multiple layers in the multi-layer (e.g., three-dimensional (3D)) stack of wafers or semiconductor structures.

Front side Si via-last approaches may use TSV etch as well as the entire BEOL dielectric stack. Backside Si via-last approaches also use wafer to wafer (or semiconductor structure to semiconductor structure) stacking. The wafers can be bonded together using oxide bonding or polymer adhesive bonding, either front-to-front or front-to-back. The wafers can be thinned by etching and/or polishing. Additionally, a TSV may be formed in the wafers by etching a via down to bond pads on a top wafer and a bottom wafer. The process includes patterning the TSVs after the contact process, lining the TSVs with a low temperature dielectric deposition, and then filling the TSVs with a single/multiple barrier metal (e.g., Cu and/or W). The TSVs are then planarized through a subsequent CMP process.

A number of inorganic and organic dielectric materials having a thickness in a range of about one hundred nanometers (nm) to about one thousand nm can be used to insulate the TSVs. TSV dielectrics may be required to have good step coverage (at least 50% through the depth of the trench), good thickness uniformity (<3% variation across the wafer), high deposition rate (>100 nm/min), low stress (<200 MPa), low leakage current (<1 nA/cm2), and high breakdown voltage (>5 MV/cm).

Plasma-enhanced chemical vapor deposition (PECVD) of $SiO_2$ or SiN, or sub-atmospheric chemical vapor depositions (SACVD) of $SiO_2$, are some examples of insulator deposition. The most commonly used conductors to fill TSVs are doped polysilicon (180 Iohm-cm), tungsten (5.6 Iohm-cm), or copper (1.7 Iohm-cm). W deposited by CVD has a good fill of the TSV and can be integrated with the contacts to which the TSVs are to be coupled. A TiN liner is required to ensure that the $WF_6$ precursor does not attack the Si substrate in the TSV. A disadvantage of W compared to Cu is that it has a high intrinsic stress (1400 MPa for W, 20 MPa for Cu). TSV can be superconducting during qubit operation. A superconducting TSV comprises a Titanium Nitride (TiN) and/or poly Si and/or Al and/or high Q metal. TSV can be provided as a combination of titanium-titanium nitride-tungsten and/or titanium-titanium nitride-high Q materials-tungsten and/or titanium-titanium nitride-high Q materials and/or titanium-high Q materials-tungsten and/or high Q materials-tungsten and/or high Q materials, etc.

Reactive-ion-etching (RIE) may be used to create high aspect ratio TSVs and deep trench structures in the Si (i.e., for capacitors or for isolation) in which the TSVs are provided. In one embodiment, a TSV RIE Bosch process may be used to fabricate the TSVs, with process alternating between deposition and etching steps to fabricate deep vias. SF6 isotropic etching of Si may not be suitable for forming TSVs (which require a highly anisotropic etch). Fluorocarbon chemistry (e.g., C4F8) may be used for anisotropic etching achieved through the deposition of a chemically inert passivation on the sidewall of the TSVs.

Chemical mechanical polishing (CMP) may be used for planarization of metal filled vias (e.g., micro vias), for example. Additionally, a metal contact (i.e. pad) in an upper device layer (e.g., the second device layer) may be an annulus with an about a one point five micrometer (μm) opening that also functions as a self-aligned mask (e.g., hard mask) during the plasma etch of the oxide beneath it to reach a corresponding metal contact in a lower device layer (e.g., the first device layer). In order to fully dispose and electrically the via, the size of the metal contacts, and thus the pitch of the vertical interconnect, is made proportional to about twice the wafer-wafer misalignment of the wafers including the first and second device layers.

Figure 1A:
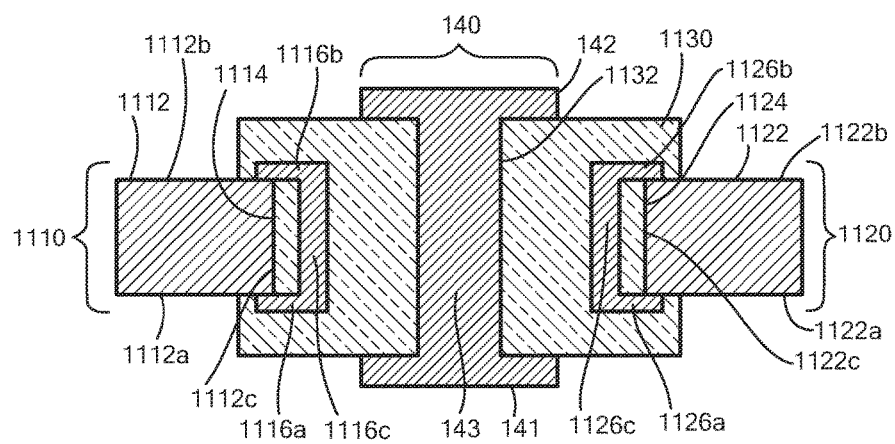
Figure 1B:
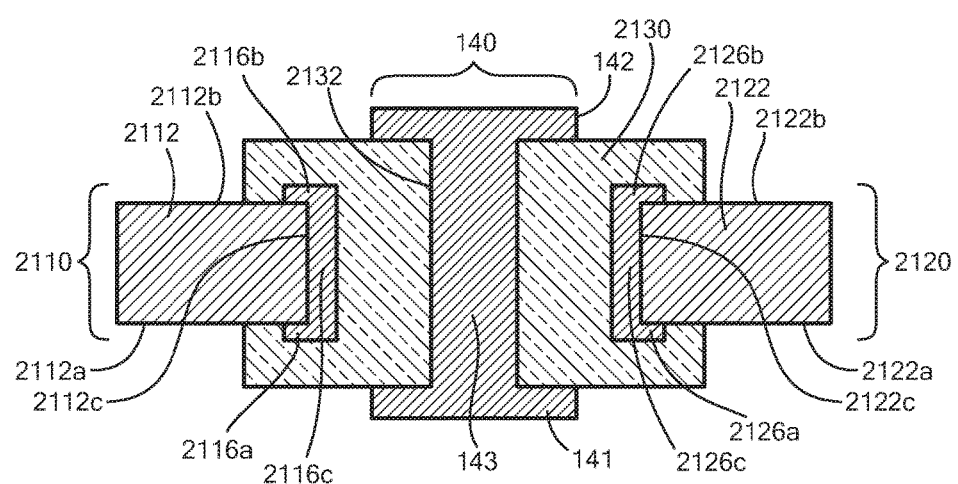

Referring now to FIGS. 1-1B, in which like elements are provided having like reference designations, example shielded through via structures according to an embodiment of the disclosure are shown.

Referring to FIG. 1, a shielded through via structure as may be formed or otherwise provided in a substrate 130 of a semiconductor structure (e.g., semiconductor structure 610, shown in FIG. 6, as will be discussed) includes a first shielding portion 110, a second shielding portion 120 and a through via structure 140. Substrate 130 is considered part of the shielded through via structure and corresponds to an oxide layer.

The first shielding portion 110 is formed or otherwise provided in a first selected portion of the substrate 130 and includes a first insulating layer 112, a first oxide layer 114 and a first conductive layer 116. The insulating layer 112 has first and second opposing surfaces (here, first and second surfaces 112a, 112b) and at least one side (here, at least side 112c). Additionally, the insulating layer 112 includes one or more electrically insulating materials. The electrically insulating materials may, for example, include Silicon (Si), glass, SiC or other known electrically insulating materials.

The oxide layer 114 has a first portion 114a disposed over first surface 112a of insulating layer 112, a second portion 114b disposed over second surface 112b of insulating layer 112, and a third portion 114c disposed over side 112c of insulating layer 112. Additionally, the oxide layer 114 includes one or more oxide materials (e.g., etch-stoppable oxide materials such as Silicon Oxide ($SiO_x$), plasma enhanced chemical vapor deposition (PECVD) oxide).

The conductive layer 116 has a first portion 116a disposed over first portion 114a of oxide layer 114, a second portion 116b disposed over second portion 114b of oxide layer 114, and a third portion 116c disposed over side 114c of oxide layer 114. Additionally, the conductive layer 116 includes one or more electrically conductive materials. The electrically conductive materials may include Niobium (Nb), Indium (In), Gold (Au), Copper (Cu), Titanium (Ti), Titanium nitride (TiN), and/or other known electrically conductive and/or high Q materials and combinations.

The second shielding portion 120, which is substantially the same as the first shielding portion 110 in the illustrated embodiment is formed or otherwise provided in a second selected portion of the substrate 130. The second shielding portion 120 includes a second insulating layer 122, a second oxide layer 124 and a second conductive layer 126. The insulating layer 122 has first and second opposing surfaces (here, first and second surfaces 122a, 122b) and at least one side (here, at least side 122c). Additionally, the insulating layer 122 includes one or more electrically insulating materials (e.g., Si). In preferred embodiments, the first and second shielding portions are the same and the metal thickness and oxide thicknesses should be symmetric.

The oxide layer 124 has a first portion 124a disposed over first surface 122a of insulating layer 122, a second portion 124b disposed over second surface 122b of insulating layer 122, and a third portion 124c disposed over side 122c of insulating layer 122. Additionally, the oxide layer 124 includes one or more oxide materials (e.g., $SiO_x$).

The conductive layer 126 has a first portion 126a disposed over first portion 124a of oxide layer 124, a second portion 126b disposed over second portion 124b of oxide layer 124, and a third portion 126c disposed over side 124c of oxide layer 124. Additionally, the conductive layer 116 includes one or more electrically conductive and/or High Q materials (e.g., Nb).

Figure 5:
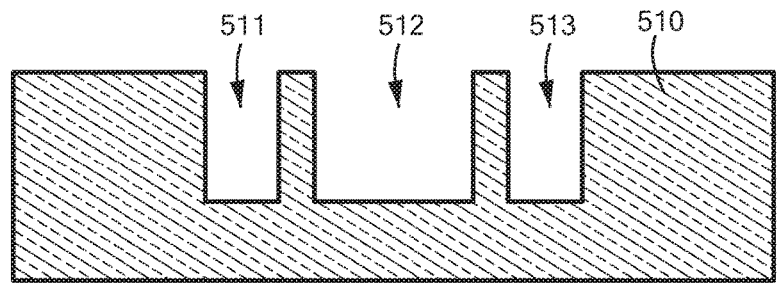
FIGS. 5-5E are block diagrams of example structures as may be provided in an example method for fabricating a shielded through via structure in accordance with a further embodiment.

Deposit second oxide layer 130 (substrate as second oxide) to cover conductive layer 116, 126. Second oxide layer 130 can fill and/or partially fill the metal (116,126) opening. For a filled oxide layer, It may be necessary to use CMP for planarization and photolithography using photoresist and/or a hard mask to etch the via to form the through via structure 140. FIGS. 5-5E illustrate an example process of creating the structure of FIG. 1.

The through via structure 140 is formed or otherwise provided in an opening 132 formed in the substrate 130. The opening 132 is spaced between the first and second selected portions of the substrate 130 in which the first and second shielding portions 110, 120 are provided.

The through via structure 140 includes a first interconnect pad or trace 141 and a second interconnect pad or trace 142, each of which has first and second opposing surfaces. Additionally, the through via structure 140 includes a through via 143 which has first and second opposing portions. In some embodiments, the through via structure may be considered to include the interconnect pads (i.e. the via may include an interconnect pad having superconducting and/or a normal UBM. The first surface of interconnect pad 141 is disposed over the first surface of the substrate 130 proximate to a first end of the substrate opening 132. Additionally, the first surface of interconnect pad 142 is disposed over the second surface of the substrate 130 proximate to a second opposing end of the substrate opening 132. The through via 143 is disposed between the first and second ends of the substrate opening 132 and extends between the first and second surfaces of the substrate 130. The first portion of through via 143 is electrically coupled to the first surface of interconnect pad 141 and the second portion of through via 143 is electrically coupled to the first surface of interconnect pad 142.

Interconnect pad 141, interconnect pad 142 and through via 143 each include one or more electrically conductive materials. In one embodiment, the electrically conductive materials are superconducting and/or partially superconducting materials (e.g., In and Nb). Additionally, in one embodiment the electrically conductive materials of interconnect pad 141, interconnect pad 142 and/or through via 143 are the same as or similar to the electrically conductive materials of conductive layer 116 of first shielding portion 110 and/or conductive layer 126 of second shielding portion 120.

In one aspect of the concepts, systems, circuits and techniques sought to be protected herein, the first and second shielding portions 110, 120 provide shielding to the through via 140. In one example, the first and second shielding portions provide "shielding" to the through via by conductive portions 116 and 126 having a ground connection and through via 140 having a signal connection separated by oxide layer 130. Here, signal connection 140 has ground shielding by elements 126-116.

Figure 6:
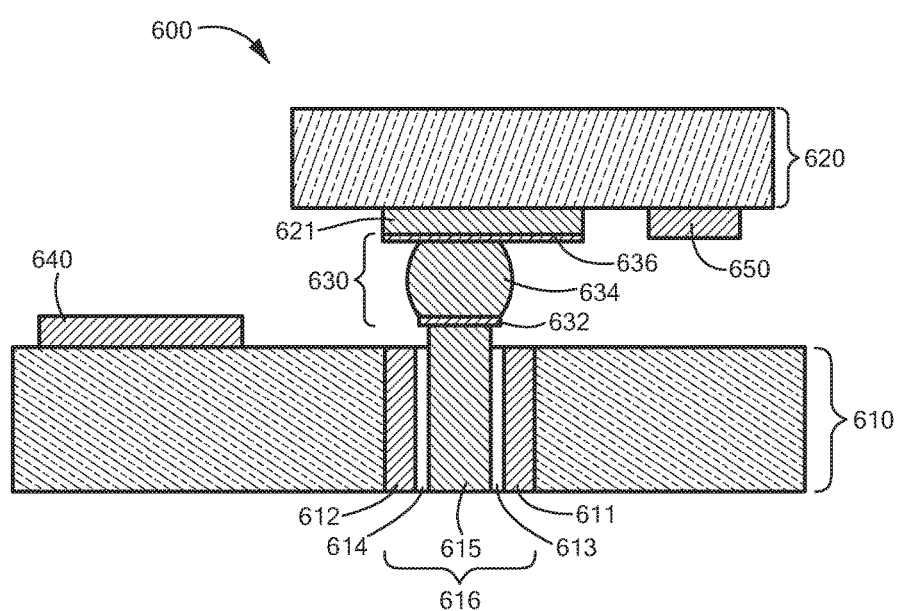
FIG. 6 is a block diagram of an example multi-layer semiconductor structure as may be formed using a shielded through via structure according to the disclosure.

The shielded through via structure may, for example, be used to electrically couple the semiconductor structure in which the substrate 130 is provided (e.g., 610, shown in FIG. 6) to one or more semiconductor structures (e.g., 620, shown in FIG. 6).

Additional aspects of the concepts, systems, circuits and techniques sought to be protected herein, with particular emphasis on the shielded via structures and semiconductor structures formed using the shielded via structures, are described in conjunction with the figures below.

Referring to FIG. 1A, another example shielded through via structure as may be formed or otherwise provided in a substrate 1130 of a semiconductor structure includes a first shielding portion 1110, a second shielding portion 1120 and through via structure 140.

The first shielding portion 1110 is formed or otherwise provided in a first selected portion of the substrate 1130 and includes a first insulating layer 1112, a first oxide layer 1114 and a first conductive layer 1116. The insulating layer 1112 has first and second opposing surfaces (here, first and second surfaces 1112a, 1112b) and at least one side (here, at least side 1112c). Additionally, insulating layer 1112, similar to insulating layer 112, includes one or more electrically insulating materials (e.g., Si). The oxide layer 1114 is disposed over side 1112c of insulating layer 1112 and includes one or more oxide materials (e.g., $SiO_x$).

The conductive layer 1116 has a first portion 1116a disposed over a first portion of oxide layer 1114 and a selected portion of the first surface 1112a of insulating layer 1112. Additionally, the conductive layer 1116 has a second portion 1116b disposed over a second portion of oxide layer 1114 and a selected portion of the second surface 1112b of insulating layer 1112. The conductive layer 1116 also has a third portion 1116c disposed over a second portion of oxide layer 1114 and a selected portion of side 1112c of insulating layer 1112. The conductive layer 1116 includes one or more electrically conductive materials (e.g., Nb).

The second shielding portion 1120, which is substantially the same as the first shielding portion 1110 in the illustrated embodiment, is formed or otherwise provided in a second selected portion of the substrate 1130. The second shielding portion 1120 includes a second insulating layer 1122, a second oxide layer 1124 and a second conductive layer 1126. The insulating layer 1122 has first and second opposing surfaces (here, first and second surfaces 1122a, 1122b) and at least one side (here, at least side 1122c). Additionally, insulating layer 1122, similar to insulating layer 1112, includes one or more electrically insulating materials (e.g., Si). The oxide layer 1124 is disposed over side 1122c of insulating layer 1122 and includes one or more oxide materials (e.g., $SiO_x$). As above, in preferred embodiments, the first and second shielding portions are substantially the same and have substantially symmetric metal and oxide thicknesses.

The conductive layer 1126 has a first portion 1126a disposed over a first portion of oxide layer 1124 and a selected portion of the first surface 1122a of insulating layer 1122. Additionally, the conductive layer 1126 has a second portion 1126b disposed over a second portion of oxide layer 1124 and a selected portion of the second surface 1122b of insulating layer 1122. The conductive layer 1126 also has a third portion 1126c disposed over a second portion of oxide layer 1124 and a selected portion of side 1122c of insulating layer 1122. The conductive layer 1126 includes one or more electrically conductive materials (e.g., Nb).

Deposit second oxide layer 1130 (substrate as second oxide) to cover conductive layer 1116, 1126. conductive layer 1116, 1126. Patterned prior to deposit second oxide 1130. Second oxide layer 1130 can fill and/or partially fill the metal (1116,1126) opening. For a filled oxide layer, it may be necessary to use CMP for planarization and photolithography using photo-resist and/or a hard mask to etch the via to form the through via structure 140. FIGS. 5-5E illustrate an example process of creating the structure of FIG. 1A.

The through via structure 140 is formed or otherwise provided in an opening 1132 formed in the substrate 1130. The opening 1132 is spaced between the first and second selected portions of the substrate 1130 in which the first and second shielding portions 1110, 1120 are provided. The first surface of interconnect pad 141 of through via structure 140 is disposed over the first surface of the substrate 1130 proximate to a first end of the substrate opening 1132. Additionally, the first surface of interconnect pad 142 of through via structure 140 is disposed over the second surface of the substrate 1130 proximate to a second opposing end of the substrate opening 1132.

The through via 143 is disposed between the first and second ends of the substrate opening 1132 and extends between the first and second surfaces of the substrate 1130. Additionally, the first portion of through via 143 is electrically coupled to the first surface of interconnect pad 141 and the second portion of through via 143 is electrically coupled to the first surface of interconnect pad 142.

Similar to the first and second shielding portions 110, 120 of the shielded through via structure shown in FIG. 1, in one aspect of the disclosure, the first and second shielding portions 1110, 1120 of the shielded through via structure shown in FIG. 1A provide shielding to the through via 143.

FIGS. 1 and 1A are two examples. In FIG. 1, first oxide 114, 124, conductive element 126,116 and second oxide 130 are patterned and etched using the same photolithography process. In FIG. 1A, first oxide 1114, 1124, conductive element 1126,1116 and second oxide 1130 are patterned and etched separately and use separate photolithographic processes. For example, in FIG. 1A, first oxide layers 1114,1124 may be deposited and/or annealed through an Si opening, then CMP may be used to remove oxide from top and bottom surface of the Si.

Referring to FIG. 1B, a further example shielded through via structure as may be formed or otherwise provided in a substrate 2130 of a semiconductor structure includes a first shielding portion 2110, a second shielding portion 2120 and through via structure 140.

The first shielding portion 2110 is formed or otherwise provided in a first selected portion of the substrate 2130 and includes a first insulating layer 2112 and a first conductive layer 2116 Here a high resistive silicon which provides a sufficient insulating characteristic with respect to conductive layer 2116 has been used. The insulating layer 2112 has first and second opposing surfaces (here, first and second surfaces 2112a, 2112b) and at least one side (here, at least side 2112c). Additionally, insulating layer 2112 includes one or more electrically insulating materials (e.g., Si).

The conductive layer 2116 has a first portion 2116a disposed over a selected portion of the first surface 2112a of insulating layer 2112. Additionally, the conductive layer 2116 has a second portion 2116b disposed over a selected portion of the second surface 2112b of insulating layer 2112. The conductive layer 2116 also has a third portion 2116c disposed over a selected portion of side 2112c of insulating layer 2112. The conductive layer 2116 includes one or more electrically conductive materials (e.g., Nb).

Deposit first oxide layer 2130 to cover conductive layer 2116, 2126. First oxide layer 2130' can fill and/or partially fill the metal (2116,2126) opening. For a filled oxide layer, It is necessary to use CMP for planarization and photolithographic techniques using photo-resist and/or a hard mask to etch a via to form the through via structure 140.

The second shielding portion 2120, which is substantially the same as the first shielding portion 2110 in the illustrated embodiment is formed or otherwise provided in a second selected portion of the substrate 2130. The second shielding portion 2120 includes a second insulating layer 2122 and a second conductive layer 2126. The insulating layer 2122 has first and second opposing surfaces (here, first and second surfaces 2122a, 2122b) and at least one side (here, at least side 2122c). Additionally, insulating layer 2122 includes one or more electrically insulating materials (e.g., Si). As noted above, in preferred embodiments, the metal thickness and oxide thickness should be symmetric.

The conductive layer 2126 has a first portion 2126a disposed over a selected portion of the first surface 2122a of insulating layer 2122. Additionally, the conductive layer 2126 has a second portion 2126b disposed over a selected portion of the second surface 2122b of insulating layer 2122. The conductive layer 2126 also has a third portion 2126b disposed over a selected portion of side 2122c of insulating layer 2122. The conductive layer 2126 includes one or more electrically conductive materials (e.g., Nb).

The through via structure 140 is formed or otherwise provided in an opening 2132 formed in the substrate 2130. The opening 2132 is spaced between the first and second selected portions of the substrate 2130 in which the first and second shielding portions 2110, 2120 are provided. The first surface of interconnect pad 141 of through via structure 140 is disposed over the first surface of the substrate 2130 proximate to a first end of the substrate opening 2132. Additionally, the first surface of interconnect pad 142 of through via structure 140 is disposed over the second surface of the substrate 2130 proximate to a second opposing end of the substrate opening 2132.

The through via 143 is disposed between the first and second ends of the substrate opening 2132 and extends between the first and second surfaces of the substrate 2130. Additionally, the first portion of through via 143 is electrically coupled to the first surface of interconnect pad 141 and the second portion of through via 143 is electrically coupled to the first surface of interconnect pad 142.

Similar to the first and second shielding portions 1110, 1120 of the shielded through via structure shown in FIG. 1A, in one aspect of the disclosure, the first and second shielding portions 2110, 2120 of the shield through via structure shown in FIG. 1B provide shielding to the through via 143.

It should be appreciated that FIG. 1B eliminates one oxide deposition step. For creating through via from around 200 micron or less wafer, FIG. 1B is a better approach. For TSV type structure where TSV reveal process required, FIGS. 1 and 1A may be a better approach. Here oxide layers 114,124 or 1114,1128 act as etch stop and protect conductive layers 116,126 or 1116,1126 during etching to reveal TSV from back side.

Figure 2:
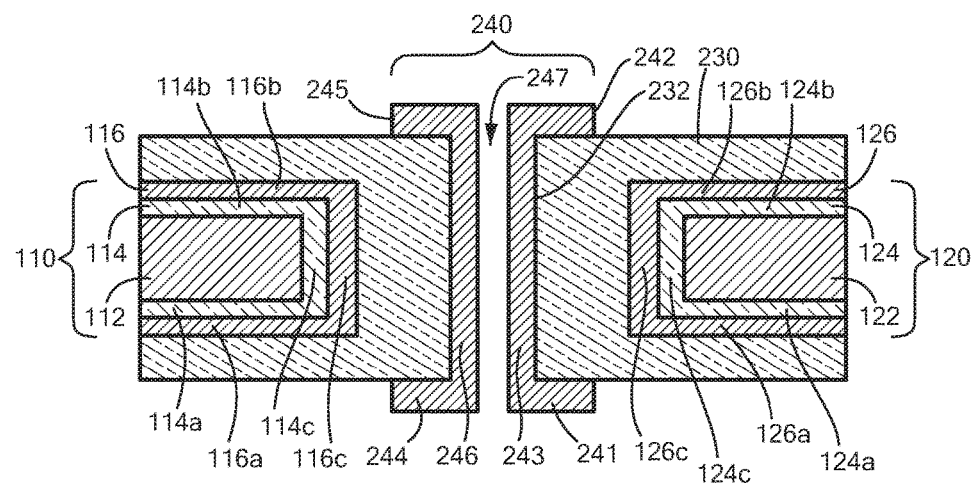
FIGS. 2-2B show cross-sections of example shielded through via structures as may be formed in accordance with another embodiment of the disclosure.
Figure 2A:
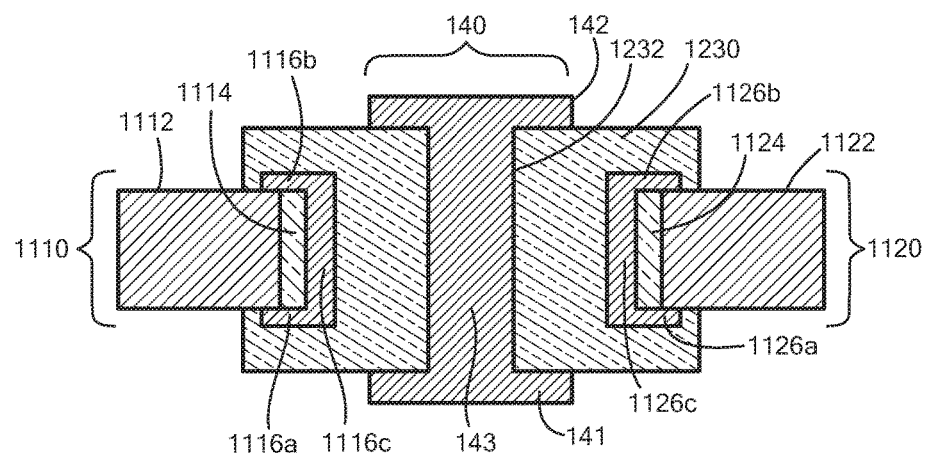
Figure 2B:
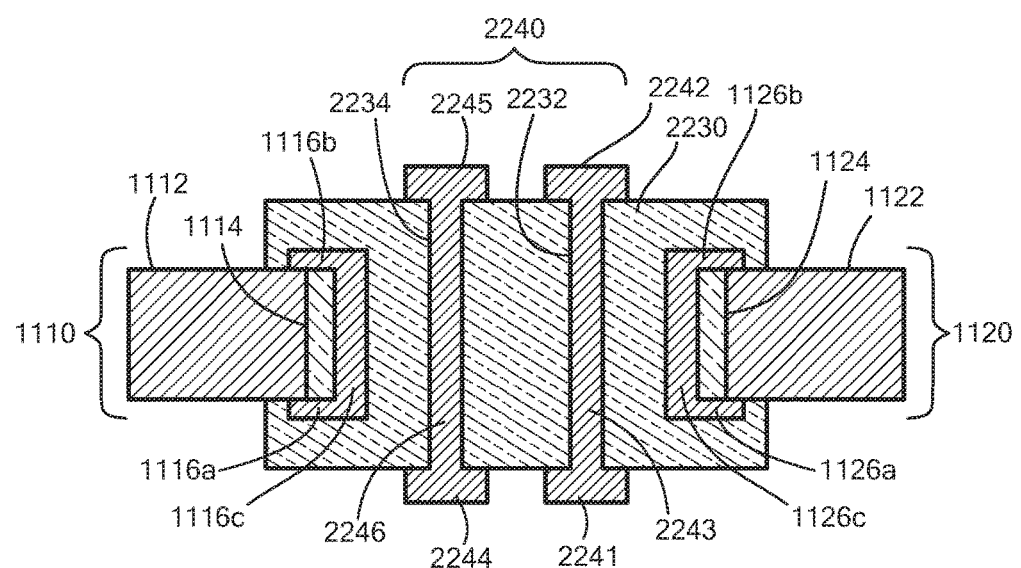

Referring now to FIGS. 2-2B, in which like elements of FIGS. 1-1B are provided having like reference designations, example shielded through via structures according to another embodiment of the disclosure are shown.

Referring to FIG. 2, a shielded through via structure as may be formed or otherwise provided in a substrate 230 of a semiconductor structure (e.g., semiconductor structure 610, shown in FIG. 6, as will be discussed) includes first shielding portion 110, second shielding portion 120 and through via structure 240. It should be noted that second oxide layer 130 may be provided as oxide or nitride or combination thereof and layer 230 may be provided as a polymer (e.g., BCB). An advantage of using polymer is that multiple vias may be formed within a shielded area (as described in FIG. 2B).

The first shielding portion 110 is formed or otherwise provided in a first selected portion of the substrate 230 and includes first insulating layer 112, first oxide layer 114 and first conductive layer 116. Additionally, the second shielding portion 120 is formed or otherwise provided in a second selected portion of the substrate 230. The second shielding portion 120 includes second insulating layer 122, second oxide layer 124 and second conductive layer 126.

The through via structure 240 is formed or otherwise provided in an opening 232 formed in the substrate 230. The opening 232 is spaced between the first and second selected portions of the substrate 230 in which the first and second shielding portions 110, 120 are provided.

The through via structure 240 includes a first interconnect pad or trace 241, a second interconnect pad or trace 242, a third interconnect pad or trace 244 and a fourth interconnect pad or trace 245. Each of the interconnect pads 241, 242, 244, 245 has first and second opposing surfaces. The through via structure 240 also includes a first through via 243, a second through via 246 and a cavity 247 formed between the first and second through vias 243, 246. The first and second through vias 243, 246 have first and second opposing portions.

The first surface of interconnect pad 241 is disposed over a first selected portion of the first surface of the substrate 230 proximate to a first end of the substrate opening 232. Additionally, the first surface of interconnect pad 242 is disposed over a first selected portion of the second surface of the substrate 230 proximate to a second opposing end of the substrate opening 232. The first through via 243 is disposed between the first and second ends of the substrate opening 232 and extends between the first and second surfaces of the substrate 230. The first portion of through via 243 is electrically coupled to the first surface of interconnect pad 241 and the second portion of through via 243 is electrically coupled to the first surface of interconnect pad 242.

The first surface of interconnect pad 244 is disposed over a second selected portion of the first surface of the substrate 230 proximate to a first end of the substrate opening 232. Additionally, the first surface of interconnect pad 245 is disposed over a second selected portion of the second surface of the substrate 230 proximate to a second opposing end of the substrate opening 232. The second through via 246 is disposed between the first and second ends of the substrate opening 232 and extends between the first and second surfaces of the substrate 230. The first portion of through via 246 is electrically coupled to the first surface of interconnect pad 244 and the second portion of through via 246 is electrically coupled to the first surface of interconnect pad 245.

Interconnect pads 241, 242, 244, 245 and through vias 243, 246 each include one or more electrically conductive materials. In one embodiment, the electrically conductive materials are superconducting and/or partially superconducting materials (e.g., In and Nb). Additionally, in one embodiment the electrically conductive materials of Interconnect pads 241, 242, 244, 245 and through vias 243, 246 are the same as or similar to the electrically conductive materials of conductive layer 116 of first shielding portion 110 and/or conductive layer 126 of second shielding portion 120.

In one embodiment, the cavity 247 formed between through vias 243, 246 in through via structure 240 is substantially empty (as shown). It should be appreciated that, for larger vias, it is sometimes difficult to fill the via or a longer process time may be required to fill the via. In one example, cavity 247 can be filled with an oxide or a polymer material. In another embodiment, the cavity 247 may be at least partially filled with a conductive material and/or an insulating material.

In one aspect of the concepts, systems, circuits and techniques sought to be protected herein, the first and second shielding portions 110, 120 provide shielding to the through via 240. In one example conductive portion 116 and 126 has ground connection and through via 140 has signal connection separated by polymer layer 230. Here signal connection 140 has ground shielding by 126-116.

Additionally, the shielded through via structure comprising the first shielding portion 110, the second shielding portion 120 and the through via structure 240 may be used to electrically couple the semiconductor structure in which the substrate 230 is provided (e.g., 610, shown in FIG. 6) to one or more semiconductor structures (e.g., 620, shown in FIG. 6).

Figure 3:
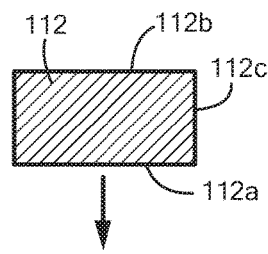
FIGS. 3-3H are block diagrams of example structures as may be provided in an example method for fabricating a shielded through via structure in accordance with an embodiment.
Figure 3C:
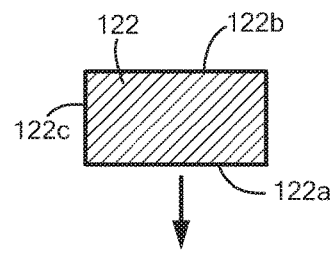
Figure 3A:
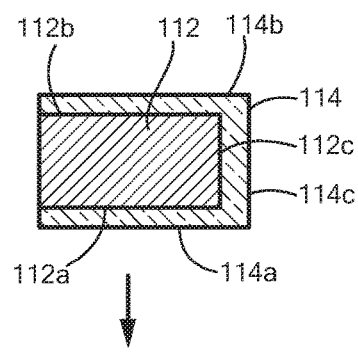
Figure 3D:
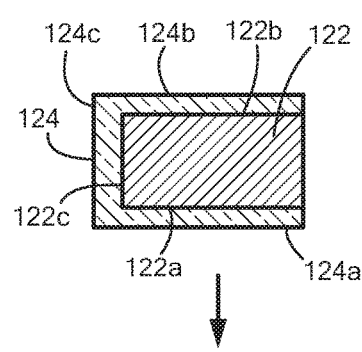
Figure 3B:
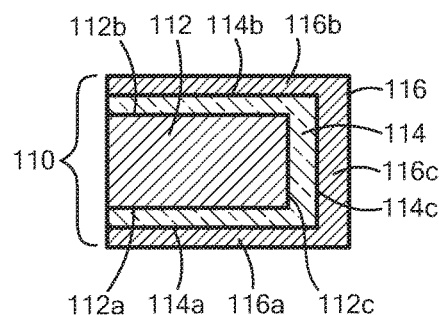

In one embodiment, polymer layer 230 (substrate as second oxide) is deposited/coated and cured to cover conductive layer 116, 126. Polymer layer 230 can fill and/or partially fill the metal (116,126) opening. For a filled oxide layer, it may be necessary to use lamination for planarization and photolithography to etch/drill the via to form the through via structure 140. In one example, polymer layer 230 is a photoimageable polymer (e.g., BCB, Su-8). FIGS. 3-3H are an example process of creating the structure of FIG. 2.

Referring to FIG. 2A, another example shielded through via structure as may be formed or otherwise provided in a substrate (or polymer layer) 1230 of a semiconductor structure includes a first shielding portion 1110, a second shielding portion 1120 and through via structure 140.

The first shielding portion 1110 is formed or otherwise provided in a first selected portion of the substrate 1230 and includes a first insulating layer 1112, a first oxide layer 1114 and a first conductive layer 1116. Additionally, the second shielding portion 1120 is formed or otherwise provided in a second selected portion of the substrate 1230. The second shielding portion 1120 includes a second insulating layer 1122, a second oxide layer 1124 and a second conductive layer 1126.

The through via structure 140 is formed or otherwise provided in an opening 1232 formed in the substrate 1230. The opening 1232 is spaced between the first and second selected portions of the substrate 1230 in which the first and second shielding portions 1110, 1120 are provided. The first surface of interconnect pad 141 of through via structure 140 is disposed over the first surface of the substrate 1230 proximate to a first end of the substrate opening 1232. Additionally, the first surface of interconnect pad 142 of through via structure 140 is disposed over the second surface of the substrate 1230 proximate to a second opposing end of the substrate opening 1232.

The through via 143 is disposed between the first and second ends of the substrate opening 1232 and extends between the first and second surfaces of the substrate 1230. Additionally, the first portion of through via 143 is electrically coupled to the first surface of interconnect pad 141 and the second portion of through via 143 is electrically coupled to the first surface of interconnect pad 142.

Similar to the first and second shielding portions 110, 120 of the shielded through via structure shown in FIG. 2, in one aspect of the disclosure, the first and second shielding portions 1110, 1120 of the shielded through via structure shown in FIG. 2A provide shielding to the through via 143. It should be noted that oxide layer 130 in FIG. 1 is replaced with polymer layer 230 in FIG. 2. Similarly, oxide layer 1130 is replaced with polymer layer 1230 in FIG. 2A. FIG. 2B has multiple through vias within a shielded zone. In one example, polymer layer 230 or 1230 can be a low loss and/or a photoimageable polymer such as Benzocyclobutene (BOB), PTFE, FEP, epoxy resin, SU-8, etc.

Referring to FIG. 2B, a further example shielded through via structure as may be formed or otherwise provided in a substrate (or polymer layer) 2230 of a semiconductor structure includes first shielding portion 1110, second shielding portion 1120 and through via structure 2240.

The first shielding portion 1110 is formed or otherwise provided in a first selected portion of the substrate 2230 and includes first insulating layer 1112, first oxide layer 1114 and first conductive layer 1116. Additionally, the second shielding portion 1120 is formed or otherwise provided in a second selected portion of the substrate 230. The second shielding portion 1120 includes second insulating layer 1122, second oxide layer 1124 and second conductive layer 1126.

The through via structure 2240 is formed or otherwise provided in openings 2232, 2234 formed in the substrate 2230. The openings 2232, 2234 are each spaced between the first and second selected portions of the substrate 2230 in which the first and second shielding portions 1110, 1120 are provided. Opening 2232 is proximate to second shielding portion 1120. Additionally, opening 2234 is proximate to the first shielding portion 1110. It should be appreciated that the thickness of layers 130 or 230 must be selected so as to provide sufficient electrical isolation.

The through via structure 2240 includes a first interconnect pad or trace 2241, a second interconnect pad or trace 2242, a third interconnect pad or trace 2244 and a fourth interconnect pad or trace 2245. Each of the interconnect pads 2241, 2242, 2244, 2245 has first and second opposing surfaces. Additionally, the through via structure 2240 includes a first through via 2243 and a second through via 2246, each having first and second opposing portions.

The first surface of interconnect pad 2241 is disposed over a first selected portion of the first surface of the substrate 2230 proximate to a first end of the substrate opening 2232. Additionally, the first surface of interconnect pad 2242 is disposed over a first selected portion the second surface of the substrate 2230 proximate to a second opposing end of the substrate opening 2232. The through via 2243 is disposed between the first and second ends of the substrate opening 2232 and extends between the first and second surfaces of the substrate 2230. The first portion of through via 2243 is electrically coupled to the first surface of interconnect pad 2241 and the second portion of through via 2243 is electrically coupled to the first surface of interconnect pad 2242.

The first surface of interconnect pad 2244 is disposed over a second selected portion of the first surface of the substrate 2230 proximate to a first end of the substrate opening 2234. Additionally, the first surface of interconnect pad 2245 is disposed over a second selected portion the second surface of the substrate 2230 proximate to a second opposing end of the substrate opening 2234. The through via 2246 is disposed between the first and second ends of the substrate opening 2234 and extends between the first and second surfaces of the substrate 2230. The first portion of through via 2246 is electrically coupled to the first surface of interconnect pad 2244 and the second portion of through via 2246 is electrically coupled to the first surface of interconnect pad 2245.

Interconnect pads 2241, 2242, 244, 2245 and through vias 2243, 2246 each include one or more electrically conductive materials. In one embodiment, the electrically conductive materials are superconducting and/or partially superconducting materials (e.g., In and Nb). Additionally, in one embodiment the electrically conductive materials of interconnect pads 2241, 2242, 2244, 2245 and through vias 2243, 2246 are the same as or similar to the electrically conductive materials of conductive layer 1116 of first shielding portion 1110 and/or conductive layer 1126 of second shielding portion 1120.

In one aspect of the disclosure, the first and second shielding portions 1110, 1120 provide shielding to the through vias 2243, 2246 (and the through via structure 2240). In one example, conductive portions 1116 and 1126 are coupled to ground and through vias 2243,2246 have a signal connection separated by polymer layer 2230. Here signal connections 2243, 2246 have ground shielding provided by layers 126-116.

Additional aspects of the concepts, systems, circuits and techniques sought to be protected herein, with particular emphasis on methods of fabricating shielded via structures according to the disclosure and semiconductor structures formed using the shielded via structures, are described in conjunction with the figures below.

Figure 3E:
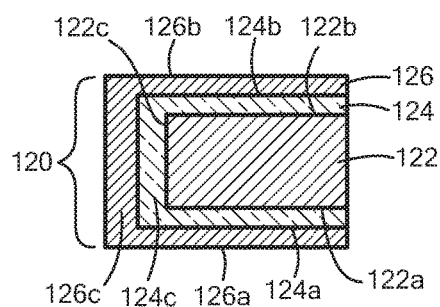

Referring now to FIGS. 3-3E, in which like elements are provided having like reference designations, example structures as may be provided in an example method for fabricating a shielded through via structure in accordance with the concepts, systems, circuits and techniques sought to be protected herein are shown. While FIGS. 3-3E are illustrated to comprise a sequence of processes, the example method is not limited to performing the illustrated processes in the sequence shown.

Referring to FIG. 3, an example insulating layer 112 as may be provided in a first shielding portion (e.g., 110, shown in FIG. 3B) of a shielded through via structure according to the disclosure is provided. The insulating layer 112 has first and second opposing surfaces (here, first and second surfaces 112a, 112b) and at least one side (here, at least side 112c). Additionally, the insulating layer 112 includes one or more electrically insulating materials. The electrically insulating materials may, for example, include Silicon (Si), glass, SiC, or other known electrically insulating materials.

It should be appreciated that FIG. 3 represents Si or glass substrates with a through via provided therein. The through via may be formed either by wet and/or dry etching process (e.g., a TSV etching process) or may be provided by a laser drilling process. In one example, an oxide hard mask is used for high aspect ratio plasma etch for deep (~200 micron) Si etching. FIG. 3A represents a single and multilayer oxide and/or nitride coated Si or glass substrates. An oxide coating may be provided by depositing oxide multiple times and deposited through both side to create uniform oxide within the via. Similar approaches can be applied when filling or coating via with single and/or multiple conventional and/or superconducting materials.

Figure 3F:
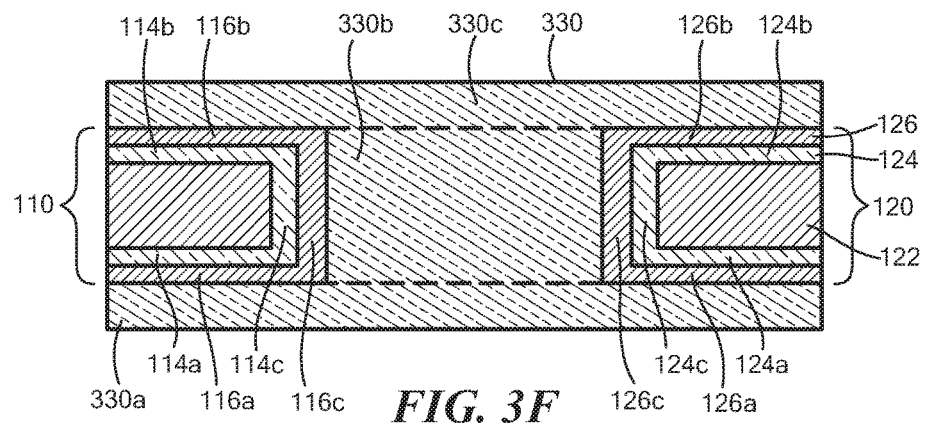
Figure 3G:
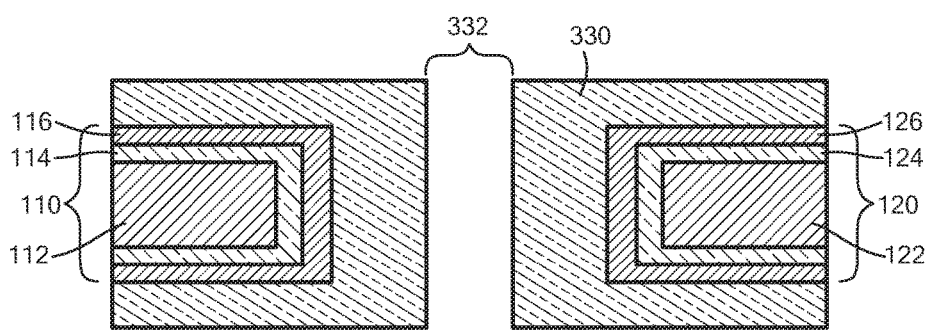
Figure 3H:
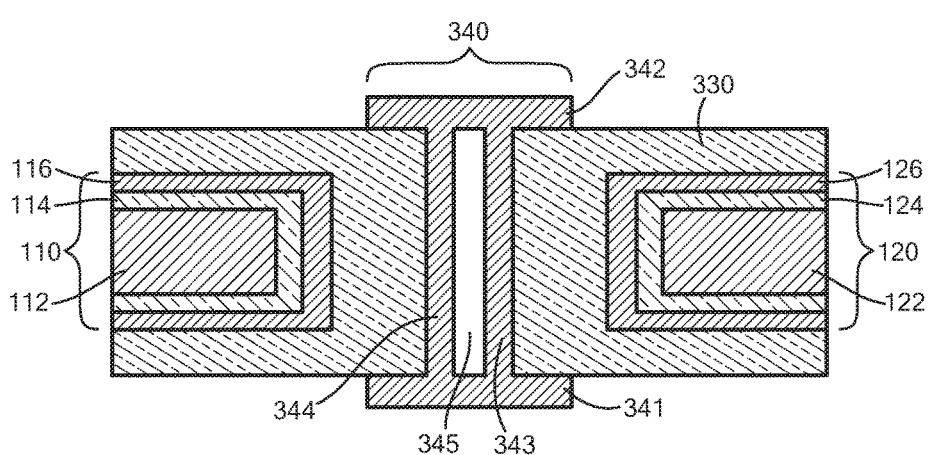

It should be appreciated that FIG. 3B represents metal deposition of oxide and/or nitride coated Si or glass substrate. In one example, Ti—TiN—W or Al or Nb or a combination thereof was deposited. FIG. 3F represents, metal coated Si was laminated with polymer. The polymer may be provided as a photo-imagable polymer (e.g., BCB, SU-8). FIG. 3G represent a through via opening through the polymer. FIG. 3H is metal deposition and pad formation to complete shielded through via. Again via metal can be Ti—TiN—W and pad metal can be Ti—Al—Ti—Pt—Au. CMP was used after depositing via metal and before depositing pad metal.

Referring now to FIG. 3A, an oxide material is deposited or otherwise disposed over selected portions of the insulating layer 112 (here, first and second surfaces 112a, 112b, and side 112c) to form an oxide layer 114. The oxide layer 114 has a first portion 114a disposed over first surface 112a of insulating layer 112, a second portion 114b disposed over second surface 112b of insulating layer 112, and a third portion 114c disposed over side 112c of insulating layer 112. Additionally, the oxide material(s) from which the oxide layer 114 is provided may include etch-stoppable oxide materials such as PECVD Silicon Oxide ($SiO_x$), or other known oxide materials.

Referring to FIG. 3B, an electrically conductive material is deposited or otherwise disposed over selected portions (here, first, second and third portions 114a, 114b, 114c) of the oxide layer 114 to form a conductive layer 116. The conductive layer 116 has a first portion 116a disposed over first portion 114a of oxide layer 114, a second portion 116b disposed over second portion 114b of oxide layer 114, and a third portion 116c disposed over third portion 114c of oxide layer 114. Additionally, the conductive materials from which the conductive layer 116 is provided may include Niobium (Ni), Indium (In), Gold (Au), Copper (Cu), Titanium (Ti), Titanium nitride (TiN), or tungsten (W) other known electrically conductive materials. Collectively, the insulating layer 112, the oxide layer 114 and the conductive layer 116 form a first shielded portion of a shielded through via structure.

Referring to FIG. 3C, an example insulating layer 122 as may be provided in a second shielding portion (e.g., 120, shown in FIG. 3E) of a shielded through via structure is provided. The insulating layer 122, similar to insulating layer 112, has first and second opposing surfaces (here, first and second surfaces 122a, 122b) and at least one side (here, at least side 122B). Additionally, the insulating layer 122 includes one or more electrically insulating materials.

Referring to FIG. 3D, an oxide material is deposited or otherwise disposed over selected portions (here, the first and second surfaces 122a, 122b, and side 122c) of the insulating layer 122 to form an oxide layer 124. The oxide layer 124 has a first portion 124a disposed over first surface 122a of insulating layer 122, a second portion 124b disposed over second surface 122b of insulating layer 122, and a third portion 124c disposed over side 122c of insulating layer 122. Additionally, the oxide layer 124 is provided from one or more oxide materials (e.g., SiO$_x$).

Referring to FIG. 3E, an electrically conductive material is deposited or otherwise disposed over selected portions (here, first, second and third portions 124a, 124b, 124c) of the oxide layer 124 to form a conductive layer 126. The conductive layer 126 has a first portion 126a disposed over first portion 124a of oxide layer 124, a second portion 126b disposed over second portion 124b of oxide layer 124, and a third portion 126c disposed over third portion 124c of oxide layer 124. Collectively, the insulating layer 122, the oxide layer 124 and the conductive layer 126 form a second shielded portion of a shielded through via structure. In one example, the structure shown in FIG. 3E may need wet chemical and/or plasma treatment to clean as well as activate insulating layer surfaces (e.g., Si or glass surfaces). In one embodiment, hexamethyldisilizane can be used to improve adhesion between the insulating layer (e.g., Si) and polymer layer. Various plasmas such as Oxygen-CF4 or Nitrogen Oxygen-CF4 or oxygen or oxygen-helium or forming gas or hydrogen plasma and combinations thereof may be used for the plasma treatment.

Referring to FIG. 3F, in which like elements of FIGS. 3B and 3E are shown having like reference designations, first shielding portion 110 and second shielding portion 120 are each provided in selected portions of a substrate 330. The substrate 330 has first and second opposing surfaces and is provided from one or more polymer materials. The substrate 330 may be provided in a semiconductor structure (e.g., 610, shown in FIG. 6).

In one embodiment, the first and second shielding portions 310, 320 are provided in the selected portions of a substrate 330 through a process in which the substrate 330 is formed from a plurality of layers (here, layers 330a, 330b, 330c) and the first and second shielding portions 310, 320 are disposed between selected ones of the layers. In particular, in the illustrated embodiment, the substrate 330 has a first substrate layer 330a, a second substrate layer 330b and a third substrate layer 330c. Each of the substrate layers 330a, 330b, 330c has first and second opposing surfaces. A first surface of first shielding portion 110, the first surface of second substrate layer 330b and a first surface of second shielding portion 120 are each disposed over selected portions of first substrate layer 330a. Additionally, the first surface of third substrate layer 330c is disposed over a second opposing surface of first shielding portion 110, the second surface of second substrate layer 330b, and a second opposing surface of second shielding portion 120. The first surface of the first substrate layer 330a corresponds to the first surface of substrate 330. Additionally, the second surface of third substrate layer 330c corresponds to the second surface of substrate 330. It should be appreciated that the substrate 330 may comprises more than or fewer than three layers in some embodiments.

In another embodiment, the first and second shielding portions 110, 120 are each provided in respective openings formed in selected portions of the substrate 330. The openings may, for example, be formed by a "subtractive" process in which the openings are etched away, or subtracted, from selected portions of the substrate 330. The selected portions of the substrate 330 may be provided in one or more layers (i.e., layers 330a, 330b, 330c) of the substrate 330.

Referring to FIG. 3G, an opening 332 is formed or otherwise provided in a selected portion of the substrate 330. The opening 332 has a predetermined shape for receiving conductive materials or structures as may be used to form a through via structure (340, shown in FIG. 3H). In the illustrated embodiment, the opening 332 extends between the first and second surfaces of the substrate 330.

The manner in which the opening 332 is formed may depend upon the materials from which the substrate 330 is provided. For example, in embodiments in which the substrate 330 is provided from a polymer that has a property of becoming more soluble when exposed to an exposure energy (e.g., ultraviolet light), the opening 332 may be formed by disposing a mask over at least one of the first and second surfaces of the substrate 330 and exposing the substrate 330 to the exposure energy. In such embodiments, the predetermined shape of the opening 332 may correspond to a pattern (or patterns) of the mask. In one example, substrate 330 may be provided as a photo-imagable polymer ((e.g., BCB, epoxy SU-8) and does not require additional photomask. Laser drilling, dry RIE etching is possible to create 332. It should be appreciated that substrate 330 may also be provided from other materials (e.g., BCB, SU-8).

The opening 332 may also be formed by etching, drilling and/or grinding selected portions of the substrate 330. It should be appreciated that opening 332 may also be formed in other manners as known to those of skill in the art.

Referring to FIG. 3H, a through via structure 340 is formed or otherwise provided in substrate opening 332 to provide a substrate 330 including a shielded through via structure. As discussed above, the substrate 330 may be provided in a semiconductor structure. The through via structure 340 includes a first interconnect pad or trace 341 and a second pad interconnect pad or trace 342. A first surface of interconnect pad 341 is disposed over the first surface of the substrate 330 proximate to a first end of the opening 342. Additionally, a first surface of interconnect pad 342 is disposed over the second surface of the substrate 330 proximate to a second opposing end of the opening 342.

The through via structure 340 also includes a through via 343 which extends from a first selected portion of the first surface of first interconnect pad 341 to a first selected portion of the first surface of second interconnect pad 342. The through via structure 340 additionally includes a second through via 344 which extends from a second select portion of the first surface of first interconnect pad 341 to a second selected portion of the first surface of second interconnect pad 342. Through vias 343, 344 are provided from one or more electrically conductive materials (e.g., copper, gold or aluminum) and are electrically coupled to interconnect pads 341, 342.

A cavity 345 exists between through vias 343, 344 in the illustrated embodiment. In one embodiment, the cavity 345 is substantially empty (as shown). Filling the cavity 345 with oxide may reduce stress. In another embodiment, the cavity 345 may be at least partially filled with a conductive material and/or an insulating material (Oxide).

Collectively, the first shielding portion 110, the second shielding portion 120, and the through via structure 340 form a shielded through via structure. The shielded through via structure may, for example, be used to electrically couple a semiconductor structure including substrate 330 to one or more other semiconductor structures (e.g., semiconductor structure 620, shown in FIG. 6, as will be discussed) via an interconnect structure (e.g., interconnect structure 630, shown in FIG. 6, as will be discussed).

Figure 4:
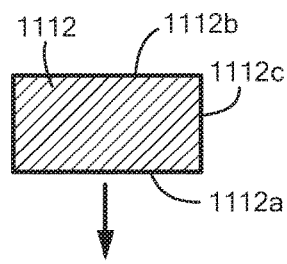
FIGS. 4-4H are block diagrams of example structures as may be provided in an example method for fabricating the shielded through via structure shown in FIG. 2A, for example.
Figure 4C:
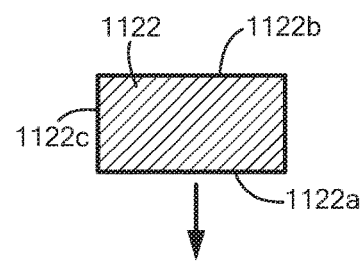
Figure 4A:
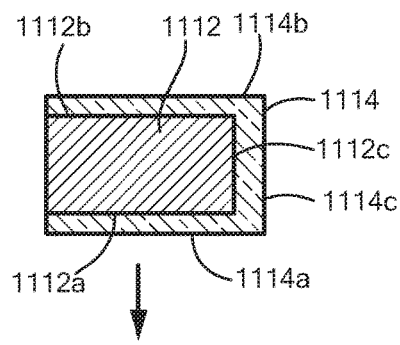
Figure 4D:
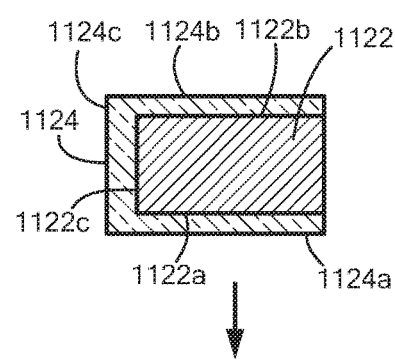
Figure 4B:
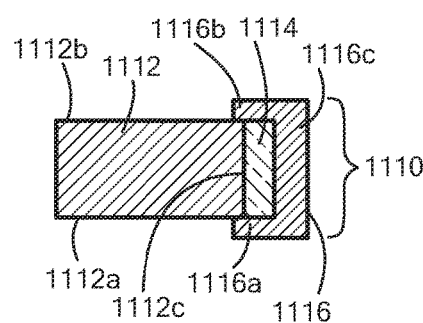
Figure 4E:
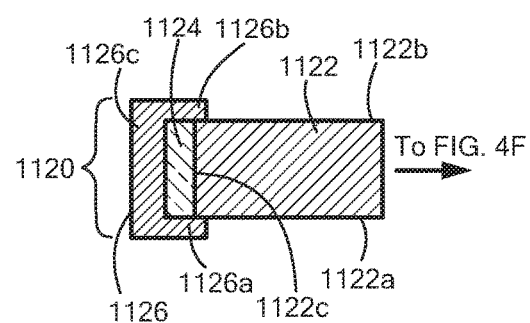
Figure 4F:
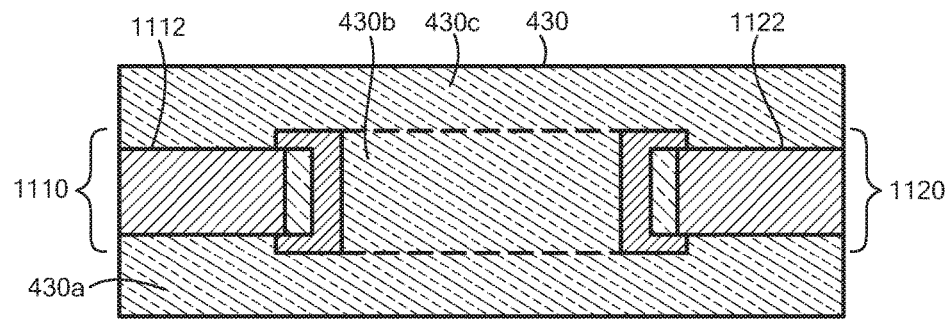
Figure 4G:
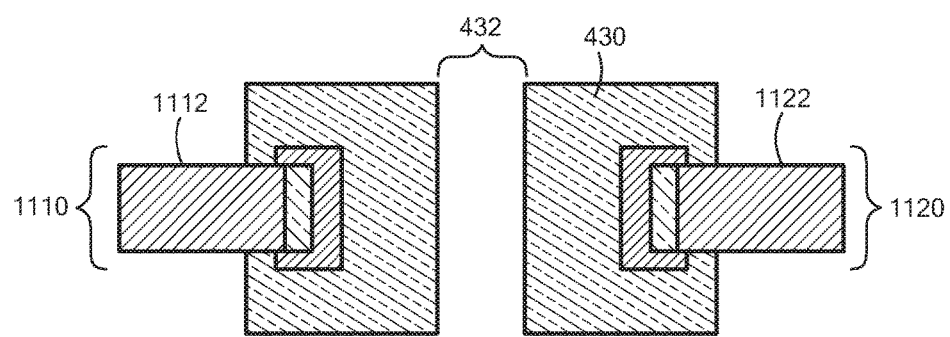
Figure 4H:
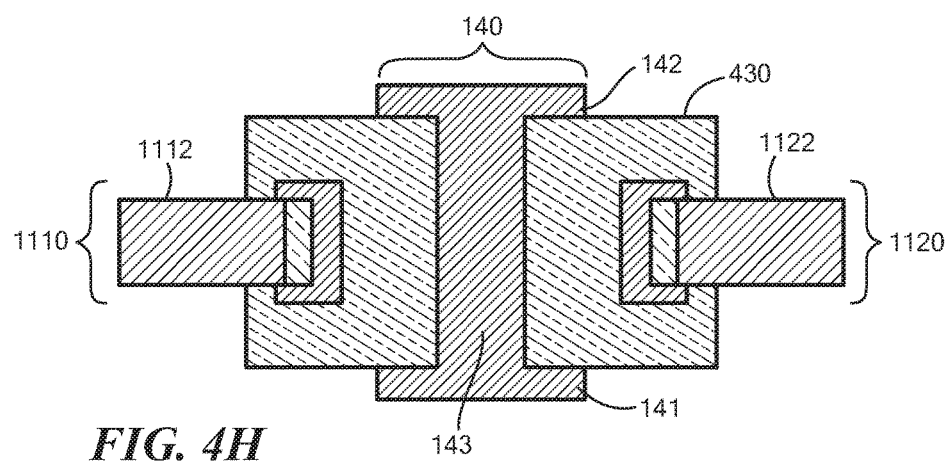

Referring now to FIGS. 4-4H, in which like elements are provided having like reference designations, example structures as may be provided in an example method for fabricating a shielded through via structure in accordance with another embodiment of the disclosure are shown. The shielded through via structure may, for example, correspond to the shielded through via structure shown in FIG. 2B.

Referring to FIG. 4, an example insulating layer 1112 as may be provided in a first shielding portion (e.g., 1110, shown in FIG. 4B) of a shielded through via structure according to the disclosure is provided. The insulating layer 1112 has first and second opposing surfaces (here, first and second surfaces 1112a, 1112b) and at least one side (here, at least one side 1112c). The insulating layer 1112 also includes one or more electrically insulating materials (e.g., Si).

Referring to FIG. 4A, an oxide material is deposited or otherwise disposed over selected portions of the insulating layer 1112 (here, first and second surfaces 1112a, 1112b, and side 1112c) to form an oxide layer 1114. The oxide layer 1114 has a first portion 1114a disposed over first surface 1112a of insulating layer 1112, a second portion 1114b disposed over second surface 1112b of insulating layer 1112, and a third portion 1114c disposed over side 1112c of insulating layer 1112. The oxide layer 1114 includes one or more oxide materials (e.g., $SiO_x$).

Referring to FIG. 4B, an electrically conductive material is deposited or otherwise disposed over the oxide layer 1114 to form a conductive layer 1116. The conductive layer 1116 includes a plurality of portions (here, portions 1116a, 1116b, 1116c). Additionally, selected portions of the oxide layer 1114 are removed from the insulating layer 1112. It should be appreciated that removing the selected portion of the oxide layer 1114 from the insulating layer 1112 makes it thinner and possibly may allow a reduced shielded via diameter and thus increase shielded via density. Collectively, the insulating layer 1112, the oxide layer 1114 and the conductive layer 1116 form a first shielding portion 1110 of a shielded through via structure.

Referring to FIG. 4C, an example insulating layer 1122 as may be provided in a second shielding portion (e.g., 1120, shown in FIG. 4E) of the shielded through via structure is provided. The insulating layer 1122, similar to insulating layer 1112, has first and second opposing surfaces (here, first and second surfaces 1122a, 1122b) and at least one side (here, at least one side 1122c). Additionally, the insulating layer 1122 includes one or more electrically insulating materials.

Referring to FIG. 4D, an oxide material is deposited or otherwise disposed over selected portions of the insulating layer 1122 (here, the first and second surfaces 1122a, 1122b, and side 1122c) to form an oxide layer 1124. The oxide layer 1124 has a first portion 1124a disposed over first surface 1122a of insulating layer 1122, a second portion 1124b disposed over second surface 1122b of insulating layer 1122, and a third portion 1124c disposed over side 1122c of insulating layer 1122.

Referring to FIG. 4E, an electrically conductive material is deposited or otherwise disposed over the oxide layer 1124 to form a conductive layer 1126. The conductive layer 1126 includes a plurality of portions (here, portions 1126a, 1126b, 1126c). Additionally, selected portions of the oxide layer 1124 are removed from the insulating layer 1122. As noted above, it should be appreciated that removing the selected portion of the oxide layer 1124 from the insulating layer 1112 makes it thinner and possibly may allow a reduced shielded via diameter and thus increase shielded via density. Collectively, the insulating layer 1122, the oxide layer 1124 and the conductive layer 1126 form a second shielding portion 1120 of the shielded through via structure.

Referring to FIG. 4F, in which like elements of FIGS. 4B and 4E are shown having like reference designations, first shielding portion 1110 and second shielding portion 1120 are each provided in selected portions of a substrate 430. The substrate 430 has first and second opposing surfaces and is provided from one or more polymer materials.

In one embodiment, the first and second shielding portions 1110, 1120 are provided in the selected portions of a substrate 430 through a process in which the substrate 430 is formed from a plurality of layers (here, layers 430a, 430b, 430c) and the first and second shielding portions 1110, 1120 are disposed between selected ones of the layers. In particular, in the illustrated embodiment, the substrate 430 has a first substrate layer 430a, a second substrate layer 430b and a third substrate layer 430c. Each of the substrate layers 430a, 430b, 430c has first and second opposing surfaces. A first surface of first shielding section 1110, first surface of second substrate layer 430b and a first surface of second shielding section 1120 are each disposed over selected portions of first substrate layer 430a. Additionally, the first surface of third substrate layer 430c is disposed over a second opposing surface of first shielding section 1110, the second surface of second substrate layer 430b, and a second opposing surface of second shielding section 1120. The first surface of the first substrate layer 430a corresponds to the first surface of substrate 430. Additionally, the second surface of third substrate layer 430c corresponds to the second surface of substrate 430. It should be appreciated that the substrate 430 may comprises more than or fewer than three layers in some embodiments.

In another embodiment, the first and second shielding portions 1110, 1120 are each provided in respective openings formed in selected portions of the substrate 430. The openings may, for example, be formed by a "subtractive" process in which the openings are etched away, or subtracted, from selected portions of the substrate 430. The selected portions of the substrate 430 may be provided in one or more layers (i.e., layers 430a, 430b, 430c) of the substrate 430.

Referring to FIG. 4G, an opening 432 is formed or otherwise provided in a selected portion of the substrate 430. Additionally, selected portions of the substrate 430 are removed from insulating layer 410 of first shielding portion 1110 and from insulating layer 1122 of second shielding portion 1120. Selected portions of the substrate 430 are removed here since this will create a through via opening. In one example, via opening 432 uses plasma (e.g., oxygen-CF4 plasma) treatment prior to metal deposition.

The opening 432 has a predetermined shape for receiving conductive materials or structures as may be used to form a through via structure (140, shown in FIG. 4H). In the illustrated embodiment, the opening 432 extends between the first and second surfaces of the substrate 430.

The manner in which the opening 432 is formed and in which the selected portions of the substrate 430 are removed may depend upon the materials from which the substrate 430 is provided. For example, in embodiments in which the substrate 430 is provided from a polymer that has a property of becoming more soluble when exposed to an exposure energy (e.g., ultraviolet light), the opening 432 may be formed by disposing a mask over at least one of the first and second surfaces of the substrate 430 and exposing the substrate 430 to the exposure energy. Additionally, the selected portions of the substrate 430 may be removed by disposing the mask over first and second surfaces of the substrate 430 and exposing the substrate 430 to the exposure energy. In such embodiments, the predetermined shape of the opening 432 and shapes of the selected portions of the substrate removed may correspond to a pattern (or patterns) of the mask. Some example materials from which substrate 430 may be provided included but are not limited to BCB, epoxy SU-8.

The opening 432 may also be formed by etching, drilling and/or grinding selected portions of the substrate 430. Additionally, the selected portions of the substrate may be removed from the insulating layers 410, 420 in a same or similar manner in which the opening 432 is formed. It should be appreciated that opening 432 and the selected portions of the substrate may also be formed and removed, respectively, in other manners as known to those of skill in the art. For example, opening 432 may also be formed using laser drilling techniques and dry RIE techniques.

Referring to FIG. 4H, a through via structure 140 is formed or otherwise provided in opening 432 to provide to provide a substrate 430 including a shielded through via structure. The through via structure 140 includes a first interconnect pad or trace 141 and a second pad interconnect pad or trace 142. A first surface of interconnect pad 141 is disposed over the first surface of the substrate 430 proximate to a first end of the opening 442. Additionally, a first surface of interconnect pad 142 is disposed over the second surface of the substrate 430 proximate to a second opposing end of the opening 442.

The through via structure 140 also includes a through via 143 which extends from a selected portion of the first surface of first interconnect pad 141 to a selected portion of the first surface of second interconnect pad 142. The through via 143 is provided from one or more electrically conductive materials (e.g., copper, gold or aluminum) and is electrically coupled to interconnect pads 141, 142.

Collectively, the first shielding portion 1110, the second shielding portion 1120, and the through via structure 140 form a shielded through via structure.

Referring now to FIGS. 5-5E, in which like elements are provided having like reference designations, example structures as may be provided in an example method for fabricating another example shielded through via structure are shown. FIGS. 5-5E use a TSV process to etch, fill and reveal via structures.

Referring to FIG. 5, an example insulating layer 510 as may be used to form a shielded through via structure is provided. The insulating layer 510 has first and second opposing surfaces and includes one or more electrically insulating materials (e.g., Si or glass). The insulating layer 510 also includes a plurality of openings (here, openings 511, 512, 513) which are formed in selected portions of the insulating layer 510. In the illustrated embodiment, opening 511 extends between a first selected portion of the second surface of insulating layer 510 and a surface proximate to the first surface of insulating layer 510. Additionally, opening 512 extends between a second selected portion of the second surface of insulating layer 510 and a surface proximate to the first surface of insulating layer 510. Further, opening 513 extends between a second selected portion of the second surface of insulating layer 510 and a surface proximate to the first surface of insulating layer 510.

In one embodiment, openings 511, 512, 513 are formed by a "subtractive" process in which the openings 511, 512, 513 are etched away, or subtracted, from the insulating layer 510. In another embodiment, the insulating layer 510 is provided with the openings 511, 512, 513 already formed in the insulating layer 510 (e.g., through a molding process). To provide opening having diameters in the 4-100 micron range reactive-ion-etching may be used. RIE is used to create high aspect ratio openings and deep trench structures in the Si (i.e., for capacitors or for isolation) in which the openings are provided. RIE Bosch process alternates between deposition and etch steps, to fabricate deep openings. SF6 isotropic etching of Si is not suitable for forming openings (which require a highly anisotropic etch). Fluorocarbon chemistry (e.g., C4F8) is used for anisotropic etching achieved through the deposition of a chemically inert passivation on the sidewall of the openings.

Figure 5A:
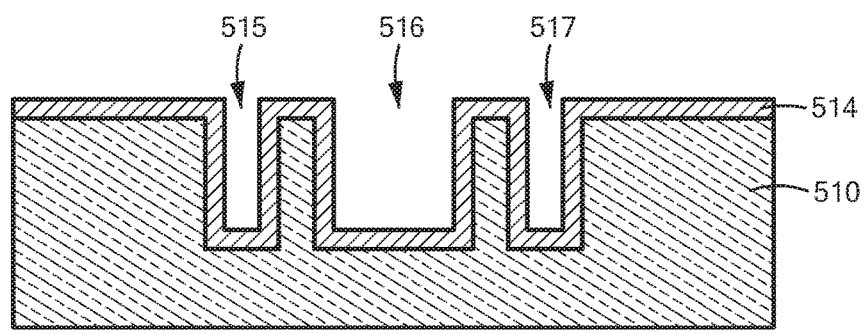

Referring to FIG. 5A, an oxide material is disposed over selected portions of the second surface of the insulating layer 510 and over selected portions of the openings 511, 512, 513 formed in the insulating layer 510 to form an oxide layer 514. The oxide layer 514 has first and second opposing surfaces and comprises a plurality of cavities (here, cavities 515, 516, 517) in the illustrated embodiment. The cavities 515, 516, 517 are shaped based upon the shapes of the openings 511, 512, 513 formed in the insulating layer 510 and an amount of oxide material disposed in the openings 511, 512, 513. With respect to oxide layer 514 a number of inorganic and organic dielectric materials having a thickness in a range of about one hundred nm to about one thousand nm can be used to insulate the via. Via dielectrics are required to have good step coverage (at least 50% through the depth of the trench), good thickness uniformity (<3% variation across the wafer), high deposition rate (>100 nm/min), low stress (<200 MPa), low leakage current (<1 nA/cm2), and high breakdown voltage (>5 MV/cm). Plasma-enhanced chemical vapor deposition (PECVD) of SiO2 or SiN, or sub-atmospheric chemical vapor depositions (SACVD) of SiO2, thermal oxide are some examples of insulator deposition.

Figure 5B:
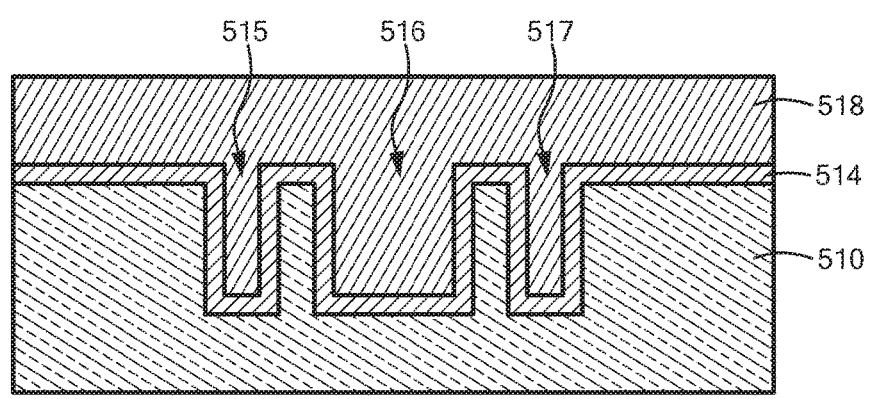

Referring to FIG. 5B, a conductive material is disposed over selected portions of the second surface of the oxide layer 514 and over selected portions of the cavities 515, 516, 517 formed in the oxide layer 514 to form a conductive layer 518. The conductive layer 518 has first and second opposing surfaces. The most commonly used conductors to fill cavities are doped polysilicon (180 Iohm-cm), tungsten (5.6 Iohm-cm), or copper (1.7 Iohm-cm). W deposited by CVD has a good fill of the cavities and can be integrated with the contacts to which the cavities are to be coupled. A TiN liner is required to ensure that the WF6 precursor does not attack the Si substrate in the cavity. A disadvantage of W compared to Cu is that it has a high intrinsic stress (1400 MPa for W, 20 MPa for Cu). In one example, TaN—TiW—W, Ti—TaN—TiN—W, Ti—TiN—TiW—W, Ti—TiN—W, Ti—TiN-High Q metal (s), Ti—TiN-Polysilicon or combinations can be used to fill the cavities.

Figure 5C:
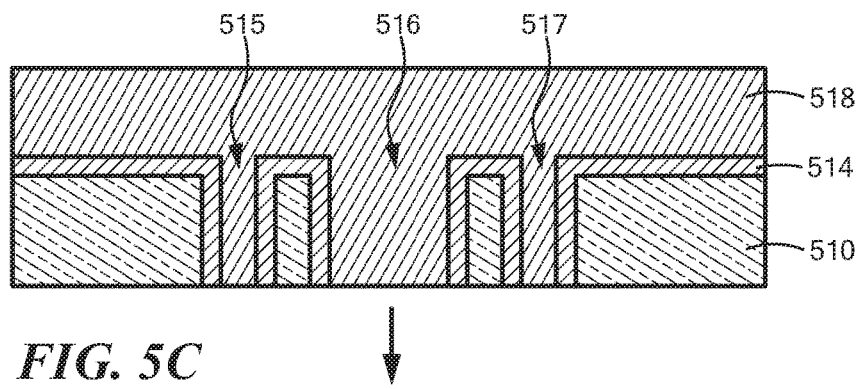

Referring to FIG. 5C, first selected portions of the insulating layer 510 and first selected portions of the oxide layer 514 are removed from the structure shown in FIG. 5B. A combination of grinding, CMP, controlled etching may be used to remove the selected portions. The first selected portions of both the insulating layer 510 and the oxide layer 514 may, for example, be removed using one or more grinding or etching processes. Alternatively top side metal 518 can be removed first by single and/or multiple CMP steps. CMP may be used for planarization of metal filled cavities. Filled cavities can further use circuitization to deposit pad metal and UBM. In one example pad metal can be Ti—Al, Ti—TiN—Al.

Figure 5D:
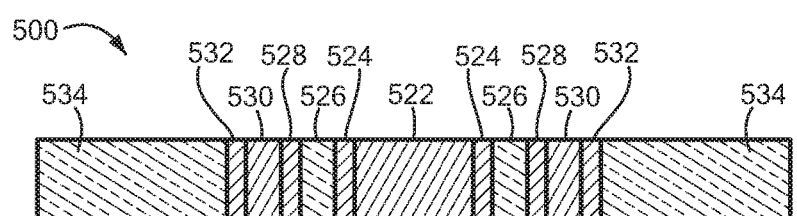
Figure 5E:
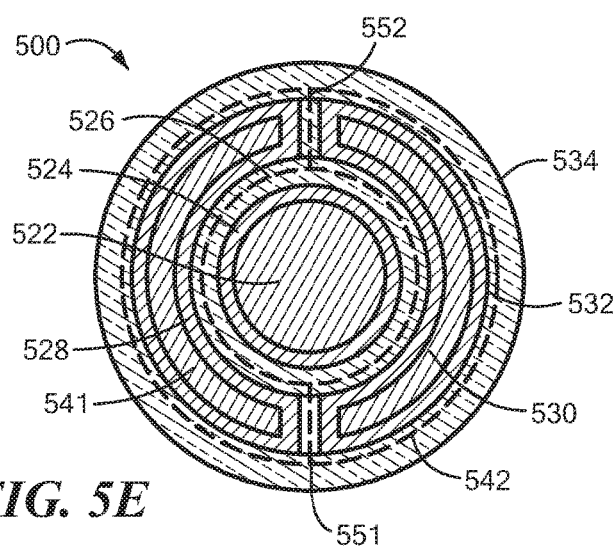

Referring to FIG. 5D, selected portions of the conductive layer 518, second selected portions of the oxide layer 514, and second selected portion of the insulating layer 510 are removed from the structure shown in FIG. 5C to form a shielded through via structure 500. A TSV process is used to remove top side metal, circuitize top side metal, temporary mount (optional), reveal TSV from back side, circuitize back side and release temporary mount. The selected portions of the conductive layer 518 may, for example, be removed using lift off and/or grinding and/or CMP techniques. Additionally, the second selected portions of both the insulating layer 510 and the oxide layer 514 may be removed using one or more grinding or CMP or etching or a combination processes. In one embodiment, FIG. 5C illustrates a patterned back side of a wafer. A temporary mounting means may be used to attach to the patterned surface when circuitizing the top side of the wafer (e.g., an Si or glass wafer). Alternatively, the front side of the wafer may be patterned first and in that case the temporary mount may be attached to the frontside of the wafer.

Referring also to the plan view of the through via structure 500 shown in FIG. 5E, the shielded through via structure 500 includes a first (here, substantially central) conductive structure (or layer) 522, a first oxide layer 524 and a first insulating layer 526. Shielded through via structure 500 also includes a second oxide layer 528, a second conductive structure 530, a third oxide layer 532 and a second insulating layer 534. First oxide layer 524 is disposed between first conductive structure 522 and first insulating layer 526. Additionally, second oxide layer 528 is disposed between first insulating layer 526 and second conductive structure 530. Further, third oxide layer 532 is disposed between second conductive structure 530 and second insulating layer 534.

In the illustrated embodiment, first conductive structure 522 forms a through via. Additionally, second oxide layer 528, second conductive structure 530 and third oxide layer 532 form first and second shielding portions 541, 542 (e.g., for shielding first conductive structure 522). A first end of the first shielding portion 541 is spaced apart from a first end of the second shielding portion 542 by an insulating material 551. Additionally, a second end of the first shielding portion 541 is spaced apart from a second end of the second shielding portion 542 by an insulating material 552. In one embodiment, in FIG. 5E, through via 522 is not shielded (or is substantially unshielded) in some selected areas such as insulating material 551 and insulating material 552. However, an appropriate process and design can be used to minimize and/or eliminate such selected areas.

FIG. 5D represents a cross-sectional view of a via and FIG. 5E represents a top view of shielded via structure. This process will provide optimal Si thickness for isolation between qubit IC to MCM (FIGS. 7-10). This process also produces the smallest shielded via for maximum possible density. Such structures generally provide partial via shielding.

The shielded through via structure 500 may be provided in a semiconductor structure (e.g., 610, shown in FIG. 6, as will be discussed) and used to electrically couple the semiconductor structure to one or more other semiconductor structures (e.g., through an interconnect structure 630, as will be discussed).

Referring now to FIGS. 6-10, in which like elements are provided having like reference designations, example multi-layer semiconductor structures (600, shown in FIG. 6) as may be fabricated using shield through via structures according to the disclosure (e.g., 500, shown in FIG. 5E) are shown.

Referring to FIG. 6, an example multi-layer semiconductor structure 600 includes a first semiconductor structure 610 and a second semiconductor structure 620. Multi-layer semiconductor structure 600 also includes an interconnect structure 630 (e.g., a superconducting or partially superconducting interconnect) for electrically and mechanically coupling the second semiconductor structure 620 to the first semiconductor structure 610.

First semiconductor structure 610 (e.g., a silicon (Si) substrate) has first and second opposing surfaces and includes a plurality of electrical connections disposed between the first and second surfaces. Additionally, first semiconductor structure 610 includes a shielded through via structure 616 that may be coupled to selected ones of the electrical connections in the first semiconductor structure 610. The shielded through via structure 616 includes a first shielding portion comprising a first conductive layer 611 and a first insulating layer 613. Additionally, the shielded through via structure 616 includes a second shielding portion comprising a second conductive layer 612 and a second insulating layer 614. The shield through via structure 616 further includes a through via 615 disposed between the first and second shielding portions. The through via 615 is filled or coated with one or more metal layers, with at least one of the metal layers comprising a superconducting material.

A superconducting integrated circuit (IC) 640 (e.g., a superconducting resonator device) is disposed over a selected portion of the second surface of first semiconductor structure 610 and may be electrically coupled to selected ones of the electrical connections in the first semiconductor structure 610. The superconducting IC 640 may, for example, be coupled to the substrate 610 using one or more superconducting or partially superconducting interconnects. Superconducting IC 640 may include one or more superconducting resonator and/or qubit and/or coupler devices. In one embodiment, superconducting IC 640 is a high Q, low loss device designed to operate in at least one of a radio frequency (RF) region and a microwave frequency region.

Second semiconductor structure 620 (e.g., a Qubit chip) has first and second opposing surfaces and includes an interconnect pad 621 which also has first and second opposing surfaces. A superconducting IC 650, which may be the same as or similar to superconducting IC 640, is disposed over a selected portion of the first surface of second semiconductor structure 620.

Second semiconductor structure 620 is coupled to (e.g., electrically and/or mechanically and/or capacitively and/or inductively coupled to) first semiconductor structure 610 through interconnect structure 630. Interconnect structure 630 has first and second opposing surfaces and includes a plurality of interconnect sections (here, three sections), each of which may include one or more superconducting or partially superconducting materials. Example materials and material compositions include: (40-400)nm Al-(5-20)nm Ti-(10-50)nm Pt-(40-200)nm Au-(1-5)μm In-(40-400)nm Au-(10-50)nm Pt-(5-20)nm Ti-(40-400)nm Al, (40-400)nm Al-(5-20)nm Ti-(10-50)nm Pt-(40-200)nm Au-(1-3)μm In-(1-3)μm Sn-(40-400)nm Au-(10-50)nm Pt-(5-20)nm Ti-(40-400)nm Al, (40-400)nm Al-(5-20)nm Ti-(100-1000)nm Sn-(1-5)μm In-(100-1000)nm Sn-(5-20)nm Ti-(40-400)nm Al.

The first surface of interconnect structure 630 is coupled to the through via 615 provided in first semiconductor structure 610. Additionally, the second surface of interconnect structure 630 is coupled to the second surface of interconnect pad 622 of second semiconductor structure 620. Interconnect structure 630 includes a first section 632 (e.g., a pillar) having first and second opposing surfaces, with the first surface corresponding to the first surface of interconnect structure 630. Interconnect structure 630 also includes a second section 634 (e.g., a solder ball, sphere, or micro-bump) having first and second opposing portions, with the first portion disposed over the second surface of first section 632. Interconnect structure 630 further includes a third section 636 (e.g., a pillar) having first and second opposing surfaces, with the first surface disposed over the second portion of second section 634. The second surface of third section 636 corresponds to the second surface of interconnect structure 630.

In some embodiments, at least one of first section 632 and third section 636 may be provided as an under bump metal (UBM). Additionally, in some embodiments, at least one of first section 632 and third section 636 may be provided as part of first semiconductor structure 610 and second semiconductor structure 620, respectively. In FIG. 6, superconducting IC 640 and/or superconducting IC 650 can be at least part of a resonator, a Josephson junction, a qubit, an inductor, a capacitor, a bias line and combinations thereof.

Semiconductor structures 610, 620 may be coupled together through a coupling (i.e., bonding) process to form multi-layer semiconductor structure 600. In particular, during the coupling process, interconnect structure 630 may melt and form an electrical connection between through via 615 of first semiconductor structure 610 and interconnect pad 622 of second semiconductor structure 620. With this technique, the through via structure described herein is provided having electrical characteristics similar to that of a coaxial transmission line and provides an RF transition having impedance and transmission characteristics appropriate for RF signals.

Figure 7:
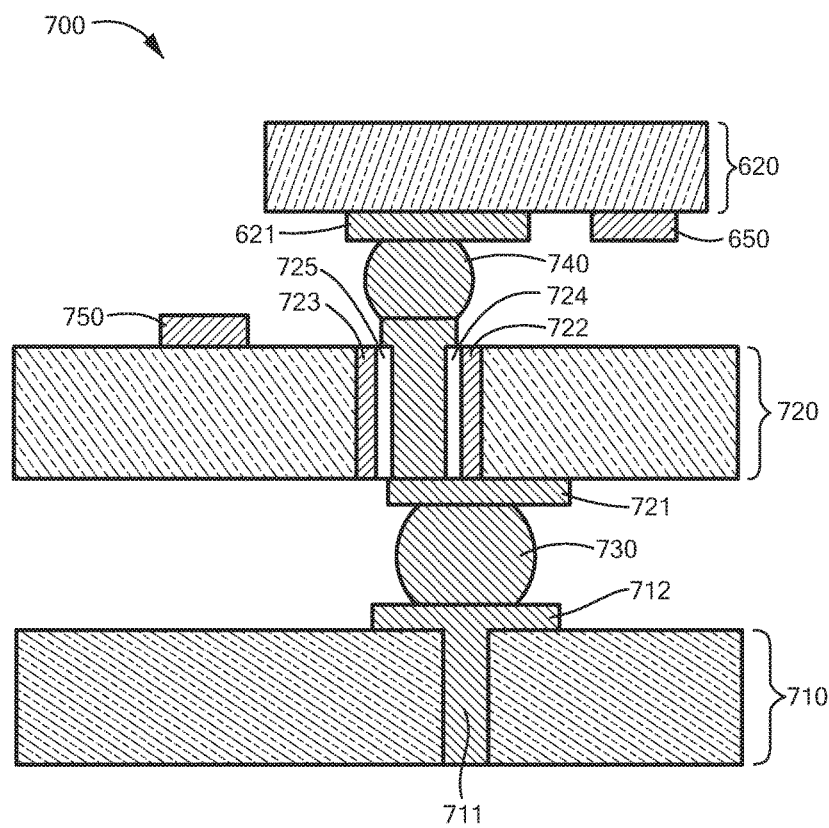
FIG. 7 is a block diagram of another example multi-layer semiconductor structure as may be formed using a shielded through via structure according to the disclosure.

Referring to FIG. 7, another example multi-layer semiconductor structure 700 according to the disclosure includes a first semiconductor structure 710, a second semiconductor structure 720 and semiconductor structure 620 (here, a third semiconductor structure 620). Multi-layer semiconductor structure 700 also includes a first interconnect structure 730 (e.g., a superconducting or partially superconducting interconnect) for electrically and mechanically coupling the second semiconductor structure 720 to the first semiconductor structure 710. Multi-layer semiconductor structure 700 additionally includes a second interconnect structure 740 (e.g., a superconducting or partially superconducting interconnect) for electrically and mechanically coupling the third semiconductor structure 620 to the second semiconductor structure 720.

First semiconductor structure 710 (e.g., a superconducting and/or a conventional multi-chip module (MCM)) has first and second opposing surfaces and includes a superconducting interconnect pad or trace 712 (e.g., a Niobium (Nb) pad) which also has first and second opposing surfaces. The first surface of interconnect pad 712 is disposed over or beneath a select portion of the second surface of first semiconductor structure 710. First semiconductor structure 710 additionally includes a conducting and/or superconducting via structure 711 which is disposed in a cavity formed between the first surface of interconnect pad 712 and the first surface of first semiconductor structure 710. Superconducting via structure 711 is electrically coupled to the first surface of interconnect pad 712.

Second semiconductor structure 720 (e.g., a silicon (Si) substrate) has first and second opposing surfaces and includes a plurality of electrical connections disposed between the first and second surfaces. Second semiconductor structure 720 also includes an interconnect pad 721 which has first and second opposing surfaces with the first surface of interconnect pad 721 disposed over a selected portion of the first surface of second semiconductor structure 720.

Second semiconductor structure 720 further includes a shielded through via structure that may be coupled to selected ones of the electrical connections in the second semiconductor structure 720. The shielded through silicon via (TSV) structure includes a first shielding portion comprising a first conductive layer 722 and a first insulating layer 724. Additionally, the shielded through silicon via (TSV) structure includes a second shielding portion comprising a second conductive layer 723 and a second insulating layer 724. The shield through silicon via structure further includes a through via 725 disposed between the first and second shielding portions. The through silicon via 725 is electrically coupled to the first surface of interconnect pad 721. Additionally, the through silicon via 725 is filled or coated with one or more metal layers, with at least one of the metal layers comprising a superconducting material. Superconducting and/or partially superconducting and/or non-superconducting metal shielded through via may be formed through at least one of: a physical vapor deposition (PVD), chemical vapor deposition (CVD), a sputtered, a magnetron sputtered, a reactive sputtered, an atomic layer deposition (ALD), a pulsed laser deposition (PLD), a plasma enhanced, a Inductive plasma (IMP) process It can be high Q metal, nitride, superconducting material, normal metal and combinations.

A superconducting integrated circuit (IC) 750 (e.g., a superconducting resonator device) is disposed over a selected portion of the second surface of second semiconductor structure 720 and may be electrically coupled to selected ones of the electrical connections in the second semiconductor structure 720. The superconducting IC 750 may be coupled to the second semiconductor structure 720 using one or more superconducting or partially superconducting interconnects.

Second semiconductor structure 720 is coupled to first semiconductor structure 710 through interconnect structure 730. Additionally, third semiconductor structure 620 is coupled to second semiconductor structure 720 through interconnect structure 740. Interconnect structures 730 and 740 may each be provided from one or more superconducting or partially superconducting materials. In one example, in FIG. 7 superconducting IC 650 and/or superconducting IC 750 can be at least part of a resonator, a Josephson junction, a qubit, an inductor, a capacitor, a bias line and combinations thereof.

Figure 8:
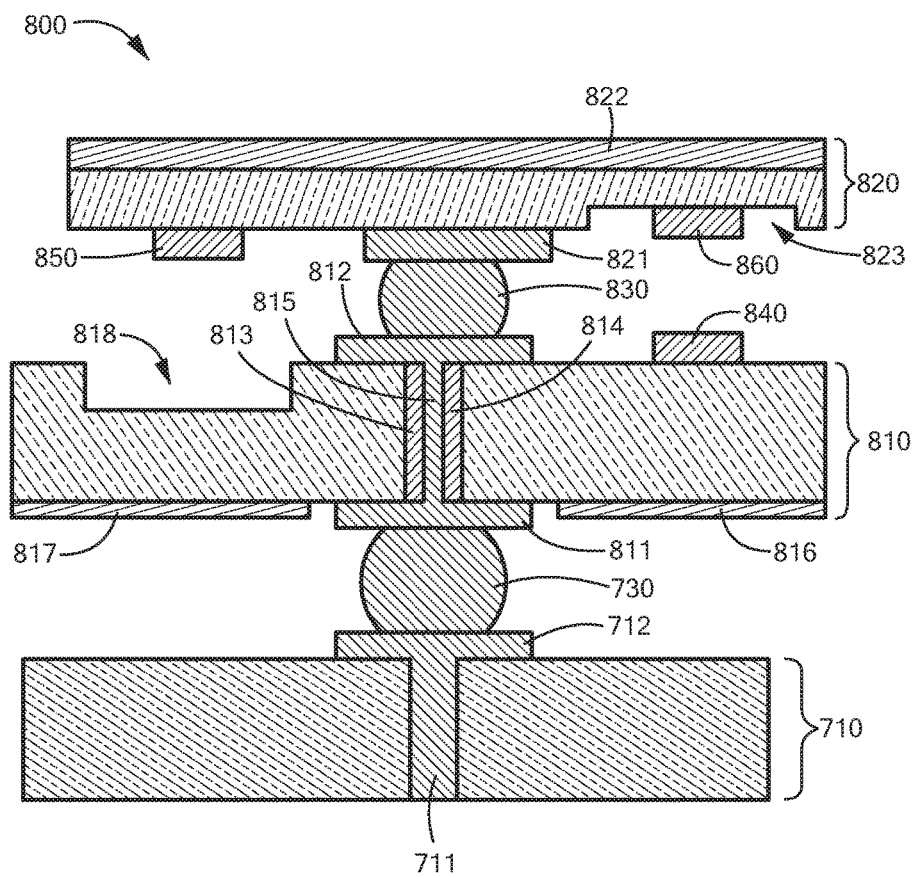
FIG. 8 is a block diagram of a further example multi-layer semiconductor structure as may be formed using a shielded through via structure according to the disclosure.

Referring to FIG. 8, another example multi-layer semiconductor structure 800 according to the disclosure includes first semiconductor structure 710, a second semiconductor structure 810 and a third semiconductor structure 820. Multi-layer semiconductor structure 800 also includes a first interconnect structure 730 (e.g., a superconducting or partially superconducting interconnect) for electrically and mechanically coupling the second semiconductor structure 810 to the first semiconductor structure 710. Multi-layer semiconductor structure 800 additionally includes a second interconnect structure 830 (e.g., a superconducting or partially superconducting interconnect) for electrically and mechanically coupling the third semiconductor structure 820 to the second semiconductor structure 810.

Second semiconductor structure 810 has first and second opposing surfaces and includes first and second interconnect pads 811, 812 and a shielded through via structure. Interconnect pad 811 has a first surface disposed over a selected portion of the first surface of second semiconductor structure 810 and interconnect pad 812 has a first surface disposed over a selected portion of the second surface of second semiconductor structure 810. The shielded through via structure, which includes the interconnect pads 811, 812 in some embodiments, is disposed between and electrically coupled to the interconnect pads 811, 812. The shielded through via structure includes a first shielding portion 813, a second shielding portion 814 and a through via 814.

Second semiconductor structure 810 further includes a plurality of high Q metal structures (here, metal structures 816, 817) which are disposed over selected portions of the first surface of second semiconductor structure 810. The metal structures 816, 817 are provided from one or more high Q metals which have very low loss at mili-Kelvin temperature zone.

A superconducting IC 840 is disposed over a selected portion of the second surface of second semiconductor structure 810. Additionally, a cavity 818 is formed in a selected portion of the second surface of second semiconductor structure 810. The purpose of the cavity is to increase isolation between the qubit and/or resonators from the lossy Si substrate.

Third semiconductor structure 820 has first and second opposing surfaces and includes an interconnect pad 821. Interconnect pad 821 is disposed over a selected portion of the first surface of third semiconductor structure 820. Third semiconductor structure 820 also includes a high Q metal structure 822 disposed over the second surface of third semiconductor structure 820. The metal structure 822 is provided from one or more high Q metals.

A superconducting IC 850 is disposed over a first selected portion of the first surface of the third semiconductor structure 820. Additionally, a superconducting IC 860 is disposed over a second selected portion of the first surface of the third semiconductor structure 820 which is provided in a cavity 823 which is provided to increase isolation between the qubit and/or resonators from the lossy Si substrate.

Second semiconductor structure 810 is coupled to first semiconductor structure 710 through interconnect structure 730. Additionally, third semiconductor structure 820 is coupled to second semiconductor structure 810 through interconnect structure 830. Interconnect structures 730 and 830 may each be provided from one or more superconducting or partially superconducting materials. In one example, In FIG. 8, superconducting IC 840 and/or superconducting IC 850 and/or superconducting IC 860 can be at least part of a resonator, a Josephson junction, a qubit, an inductor, a capacitor, a bias line and combinations. In another example, etched structure 818 can be uniformly distributed throughout the chip for creating spacer. Alternatively, in FIG. 8, the TSV (e.g., 813, 814, 815) can be a signal TSV which is surrounded by multiple ground TSVs to provide ground shielding to the signal TSV. In another example, signal microbumps (e.g., 730,830) may be attached to the TSV (e.g., 813, 814, 815) and surrounded by multiple ground bumps or multiple ground bumps attached to ground TSVs to provide shielding.

Figure 9:
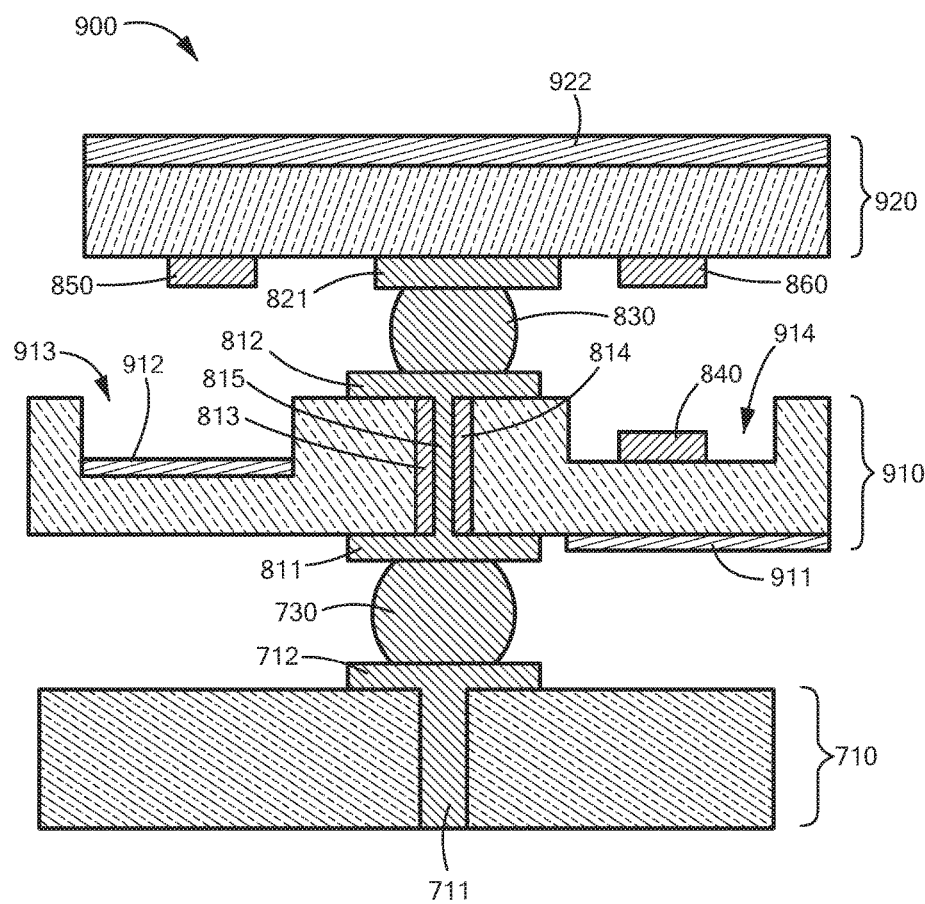
FIG. 9 is a block diagram of another example multi-layer semiconductor structure as may be formed using a shielded through via structure according to the disclosure.

Referring to FIG. 9, a further example multi-layer semiconductor structure 900 according to the disclosure includes first semiconductor structure 710, a second semiconductor structure 910 and a third semiconductor structure 920. Multi-layer semiconductor structure 900 also includes a first interconnect structure 730 (e.g., a superconducting or partially superconducting interconnect) for electrically and mechanically coupling the second semiconductor structure 910 to the first semiconductor structure 710. Multi-layer semiconductor structure 900 additionally includes a second interconnect structure 830 (e.g., a superconducting or partially superconducting interconnect) for electrically and mechanically coupling the third semiconductor structure 920 to the second semiconductor structure 910.

Second semiconductor structure 910 has first and second opposing surfaces and includes first and second interconnect pads 811, 812 and a shielded through via structure. Interconnect pad 811 has a first surface disposed over a selected portion of the first surface of second semiconductor structure 910 and interconnect pad 812 has a first surface disposed over a selected portion of the second surface of second semiconductor structure 910. The shielded through via structure, which includes the interconnect pads 811, 812 in some embodiments, is disposed between and electrically coupled to the interconnect pads 811, 812. The shielded through via structure includes a first shielding portion 813, a second shielding portion 814 and a through via 814.

Second semiconductor structure 810 further includes a plurality of high Q metal structures (here, metal structures 911, 912). High Q metal structure 911 is disposed over a selected portion of the first surface of second semiconductor structure 910. Additionally, high Q metal structure 912 is disposed over a selected portion of the second surface of the second semiconductor structure 910 in a cavity 913 in the illustrated embodiment. Superconducting IC 840 is disposed over a selected portion of the second surface of second semiconductor structure 914 in a cavity 914.

Third semiconductor structure 920 has first and second opposing surfaces and includes an interconnect pad 921. Interconnect pad 921 is disposed over a selected portion of the first surface of third semiconductor structure 920. Third semiconductor structure 920 also includes a high Q metal structure 922 disposed over the second surface of third semiconductor structure 920.

Superconducting IC 850 is disposed over a first selected portion of the first surface of the third semiconductor structure 920. Additionally, superconducting IC 860 is disposed over a second selected portion of the first surface of the third semiconductor structure 920.

Second semiconductor structure 910 is coupled to first semiconductor structure 710 through interconnect structure 730. Additionally, third semiconductor structure 920 is coupled to second semiconductor structure 910 through interconnect structure 830. Interconnect structures 730 and 830 may each be provided from one or more superconducting or partially superconducting materials. In one example, In FIG. 9, superconducting IC 840 and/or superconducting IC 850 and/or superconducting IC 860 can be at least part of a resonator, a Josephson junction, a qubit, an inductor, a capacitor, a bias line and combinations thereof.

Figure 10:
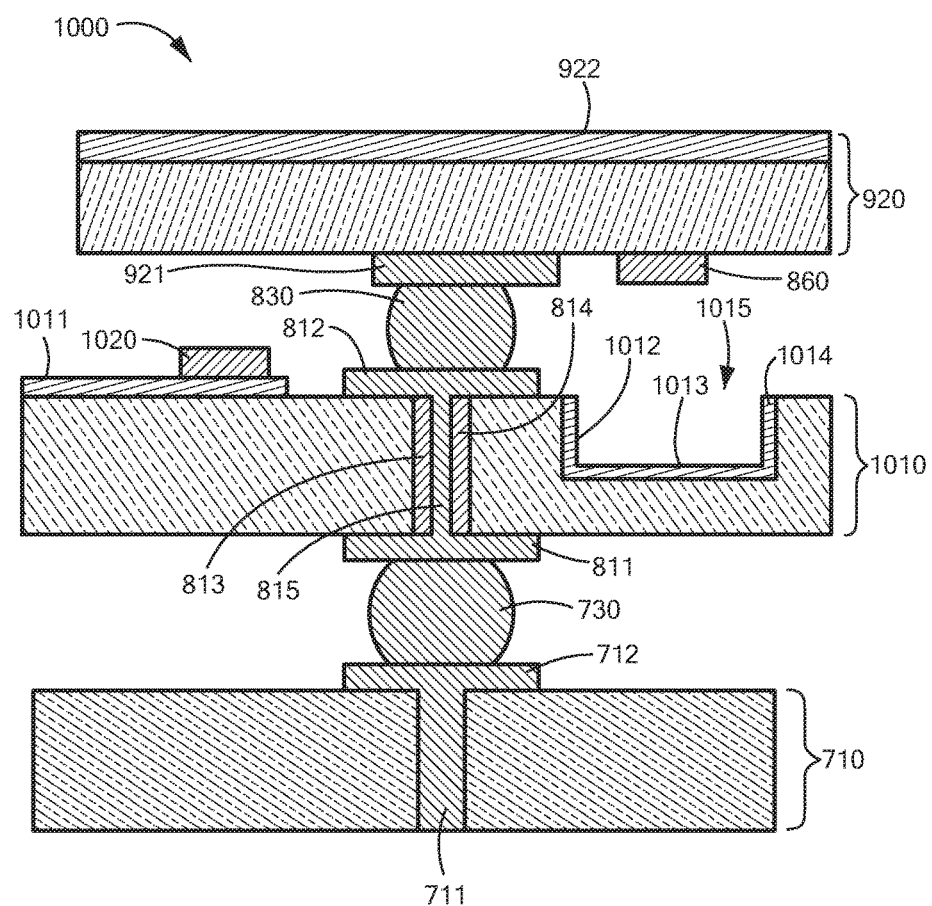
FIG. 10 is a block diagram of a further example multi-layer semiconductor structure as may be formed using a shielded through via structure according to the disclosure.

Referring to FIG. 10, another example multi-layer semiconductor structure 1000 according to the disclosure includes first semiconductor structure 710, a second semiconductor structure 1010 and third semiconductor structure 920. Multi-layer semiconductor structure 1000 also includes a first interconnect structure 730 (e.g., a superconducting or partially superconducting interconnect) for electrically and mechanically coupling the second semiconductor structure 1010 to the first semiconductor structure 710. Multi-layer semiconductor structure 1000 additionally includes a second interconnect structure 830 (e.g., a superconducting or partially superconducting interconnect) for electrically and mechanically coupling the third semiconductor structure 920 to the second semiconductor structure 1010.

Second semiconductor structure 1010 has first and second opposing surfaces and includes first and second interconnect pads 811, 812 and a shielded through via structure. Interconnect pad 811 has a first surface disposed over a selected portion of the first surface of second semiconductor structure 1010 and interconnect pad 812 has a first surface disposed over a selected portion of the second surface of second semiconductor structure 1010. The shielded through via structure, which includes the interconnect pads 811, 812 in some embodiments, is disposed between and electrically coupled to the interconnect pads 811, 812. The shielded through via structure includes a first shielding portion 813, a second shielding portion 814 and a through via 814.

Second semiconductor structure 1010 further includes a plurality of high Q metal structures (here, metal structures 1011, 1012, 1013, 1014). High Q metal structure 1011 is disposed over a first selected portion of the second surface of second semiconductor structure 1010. Additionally, high Q metal structures 1012, 1013, 1014 are each disposed over a selected portion of the second surface of the second semiconductor structure 1010 in a cavity 1015 in the illustrated embodiment. A superconducting IC 1020 is disposed over high Q metal structure 1011.

Second semiconductor structure 1010 is coupled to first semiconductor structure 710 through interconnect structure 730. Additionally, third semiconductor structure 920 is coupled to second semiconductor structure 1010 through interconnect structure 830. Interconnect structures 730 and 830 may each be provided from one or more superconducting or partially superconducting materials. In one example, in FIG. 10, superconducting IC 860 and/or superconducting IC 1020 can be at least part of a resonator, a Josephson junction, a qubit, an inductor, a capacitor, a bias line and combinations thereof.

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

It is to be appreciated that the concepts, systems, circuits and techniques sought to be protected herein are not limited to use in a particular application (e.g., circuitry in mobile phones, tablets, digital cameras and the like). In contrast, the concepts, systems, circuits and techniques sought to be protected herein may be found useful in substantially any application where a semiconductor manufacturer desires to fabricate multi-layer semiconductor structures (and devices) including superconducting semiconductor structures or integrated circuits.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A shielded through via based electronic package, comprising:
  a superconducting integrated circuit having first and second opposing surfaces, each of the first and second opposing surfaces having a first circuit including a plurality of electrical conductors disposed thereon;
  a superconducting and/or a partially superconducting circuitized substrate having first and second opposing surfaces, each of the first and second opposing surfaces having a second circuit including a plurality of electrical conductors disposed thereon; and
  an interposer having first and second opposing surfaces with each surface including a plurality of electrical conductors disposed thereon, the interposer disposed substantially between said superconducting integrated circuit and said superconducting and/or partially superconducting circuitized substrate, said second surface of said interposer electrically interconnecting said first circuit of said superconducting integrated circuit and said first surface of said interposer electrically interconnecting said second circuit of said superconducting and/or partially superconducting circuitized substrate using a superconducting and/or a partial superconducting interconnect, and electrically interconnecting select ones of the electrical conductors of the first circuit with corresponding select ones of the electrical conductors of the second circuit, said interposer including at least one through shielded via having first and second opposing surfaces electrically interconnecting corresponding first and second opposing surfaces of the interposer, the at least one through shielded via coated with, filled with, or partially filled with a high quality factor material composition and electrically coupled to the select ones of the electrical conductors of the first circuit and to the select electrical conductors of the second circuit by said interposer to yield an electrical interconnect that goes from second circuit-first interposer-first shielded via-second shielded via-second interposer-first circuit interconnect.

2. The shielded through via based electronic package of claim 1, further including:
  at least one of: a resonator, a Josephson junction, a qubit, an inductor, a capacitor, and a bias line disposed horizontally between said second surface of the interposer and said superconducting integrated circuit and electrically and/or inductively and/or capacitively coupled to said integrated circuit.

3. The shielded through via based electronic package of claim 1 wherein the at least one shielded through via further includes at least one oxide layer and/or nitride layer and/or low loss polymer layer, wherein the at least one oxide layer and/or nitride layer and/or polymer layer is formed prior to the at least one through via being coated with, filled with, or partially filled with the high quality factor material.

4. The shielded through via based electronic package of claim 1 wherein the at least one shielded through via is formed through at least one of: a physical vapor deposition (PVD), chemical vapor deposition (CVD), a sputtered, a magnetron sputtered, a reactive sputtered, an atomic layer deposition (ALD), a pulsed laser deposition (PLD), a plasma enhanced, a Inductive plasma (IMP) process.

5. The shielded through via based electronic package of claim 2 further including:
  at least one of a: resonator, a Josephson junction, a qubit, an inductor, a capacitor, and a resistor, and
  a bias line disposed between the second circuit and said first surface of the interposer and electrically and/or inductively and/or capacitively coupled to said superconducting integrated circuit.

6. The shielded through via based electronic package of claim 1 wherein said interposer includes at least one shielded area, the at least one shielded area including single or multiple through vias, the single or multiple through vias including a substantially low stress high quality factor material composition.

7. The shielded through via based electronic package of claim 1 wherein the at least one through via is filled and/or partially filled with at least one of an evaporated metal, a sputtered metal and a plated metal.

8. The shielded through via based electronic package of claim 1 wherein the interposer includes partially and/or fully etched silicon (Si) and at least one through via has first and second opposing portions and the electronic package further includes first and second pluralities of conductive pads located on the first and second opposing portions of the at least one through via.

9. The shielded through via based electronic package of claim 8 further including:
  at least one of: a resonator, a Josephson junction, a qubit, an inductor, a capacitor, and a bias line disposed between said etched Si surface of interposer and said superconducting integrated circuit and electrically and/or inductively and/or capacitively coupled to said integrated circuit.

10. The shielded through via based electronic package of claim 9 wherein the interposer includes partially and/or fully etched silicon which acts as a spacer.

* * * * *